US008415209B2

(12) United States Patent
Rooyackers et al.

(10) Patent No.: US 8,415,209 B2
(45) Date of Patent: Apr. 9, 2013

(54) METHOD OF MANUFACTURING A COMPLEMENTARY NANOWIRE TUNNEL FIELD EFFECT TRANSISTOR SEMICONDUCTOR DEVICE

(75) Inventors: Rita Rooyackers, Kessel-lo (BE); Daniele Leonelli, Leuven (BE); Anne Vandooren, Mazy (BE); Anne S. Verhulst, Houtvenne (BE); Roger Loo, Kessel-lo (BE); Stefan De Gendt, Wijnegem (BE)

(73) Assignees: IMEC, Leuven (BE); Katholieke Universiteit Leuven, K.U. Leuven R&D, Leuven (BE)

( * ) Notice: Subject to any disclaimer, the term of this patent is extended or adjusted under 35 U.S.C. 154(b) by 29 days.

(21) Appl. No.: 13/083,387

(22) Filed: Apr. 8, 2011

(65) Prior Publication Data

US 2011/0253981 A1 Oct. 20, 2011

(30) Foreign Application Priority Data

Apr. 19, 2010 (EP) .................................. 10160382

(51) Int. Cl.
*H01L 21/84* (2006.01)
(52) U.S. Cl.
USPC ........................................................ 438/149
(58) Field of Classification Search ................. 438/149, 438/152, 155; 257/347
See application file for complete search history.

(56) References Cited

U.S. PATENT DOCUMENTS

| 2005/0164433 | A1* | 7/2005 | Doris et al. | 438/149 |
| 2006/0006391 | A1* | 1/2006 | Matsumura et al. | 257/72 |
| 2006/0006463 | A1* | 1/2006 | Islam et al. | 257/347 |
| 2006/0008954 | A1* | 1/2006 | Kavalieros et al. | 438/149 |
| 2006/0014336 | A1* | 1/2006 | Meng Lee et al. | 438/157 |
| 2006/0019434 | A1* | 1/2006 | Jeong et al. | 438/152 |
| 2007/0228491 | A1  | 10/2007 | Forbes | |
| 2007/0298549 | A1* | 12/2007 | Jurczak et al. | 438/149 |
| 2008/0142786 | A1  | 6/2008 | Datta et al. | |
| 2008/0224224 | A1  | 9/2008 | Vandenderghe et al. | |
| 2009/0026553 | A1  | 1/2009 | Bhuwalka et al. | |

FOREIGN PATENT DOCUMENTS

| EP | 1 900 681 A1 | 3/2008 |
| EP | 1 901 355 A1 | 3/2008 |
| FR | 2 923 651 A1 | 5/2009 |

OTHER PUBLICATIONS

Heyns et al., "Shaping the future of nanoelectronics beyond the Si roadmap with new materials and devices", Optical Microlithography XXIII, edited by Mircea V. Dusa, Will Conley, Proc. of SPIE vol. 7640, 764003, 2010.
Khatami, Y, "Steep Subthreshold Slope n- and p-Type Tunnel-FET Devices for Low-Power and Energy-Efficient Digital Circuits", IEEE Transactions on Electron Devices, vol. 56, Nov. 2009, 2752.
Verhulst et al., "Tunnel Field-Effect Transistors for Future Low-Power Nanoelectronics", ECS Transactions, 25 (7), 455-462 (2009).

* cited by examiner

*Primary Examiner* — Nathan Ha
(74) *Attorney, Agent, or Firm* — Knobbe Martens Olson & Bear, LLP

(57) ABSTRACT

The present disclosure provides a method for manufacturing at least one nanowire Tunnel Field Effect Transistor (TFET) semiconductor device. The method comprises providing a stack comprising a layer of channel material with on top thereof a layer of sacrificial material, removing material from the stack so as to form at least one nanowire from the layer of channel material and the layer of sacrificial material, and replacing the sacrificial material in the at least one nanowire by heterojunction material. A method according to embodiments of the present disclosure is advantageous as it enables easy manufacturing of complementary TFETs.

12 Claims, 21 Drawing Sheets

METHOD OF MANUFACTURING A COMPLEMENTARY NANOWIRE TUNNEL FIELD EFFECT TRANSISTOR SEMICONDUCTOR DEVICE

CROSS-REFERENCE TO RELATED APPLICATION

This application claims the benefit under 35 U.S.C. §119 (a)-(d) of European application No. 10160382.7, filed Apr. 19, 2010, the disclosure of which is hereby expressly incorporated by reference in its entirety and is hereby expressly made a portion of this application.

FIELD

The present disclosure relates to the field of semiconductor devices and nanotechnology. More specifically, the disclosure relates to a nanostructure semiconductor device, more specifically a tunnel field effect transistor having a heterostructure nanowire, and a method for manufacturing such tunnel field effect transistor devices with integrated nanowires. In particular the present disclosure relates to a method for manufacturing complementary vertical TFETS, and to complementary TFETs thus obtained.

BACKGROUND

Microelectronic devices are generally fabricated on semiconductor substrates as integrated circuits. A complementary metal-oxide-semiconductor (CMOS) field effect transistor is one of the core elements of the integrated circuits. Dimensions and operating voltages of CMOS transistors are continuously reduced, or scaled down, to obtain ever-higher performance and packaging density of the integrated circuits.

One of the problems due to the scaling down of CMOS transistors, is that the power consumption keeps increasing. This is partly because leakage currents are increasing (e.g. due to short channel effects) and because it becomes difficult to decrease the supply voltage. The latter is mainly due to the fact that the subthreshold slope is limited to minimally about 60 mV/decade, such that switching the transistor from ON to OFF needs a certain voltage variation and therefore a minimum supply voltage.

Tunnel field-effect transistors (TFETs) are typically advertised as successors of metal-oxide semiconductor field-effect transistors (MOSFETs), because of their absence of short-channel effects and because of their resulting low off-currents. Another advantage of TFETs is that the subthreshold slope can be less than 60 mV/dec, the physical limit of conventional MOSFETs, such that potentially lower supply voltages can be used. However, TFETs typically suffer from low on-currents, a drawback related to the large resistance of the tunnel barrier.

Silicon-based TFETs are the most attractive because they allow for a full re-use of the existing expertise in fabricating high-quality silicon-compatible gate dielectrics. However, the small band-to-band tunneling efficiency in large-bandgap silicon results in low on-currents of the all-silicon TFETs. To improve the on-currents while maintaining a silicon-channel, the incorporation of heterostructures has been proposed.

In EP1900681, a method of fabricating an improved TFET using nanowires is disclosed. The method comprises providing a source contact on a substrate, and growing on the source contact a nanowire structure having an integrated source region, a channel region, a heterosection, and a drain region. The source region, channel region and drain region are made from a first semiconductor material and the heterosection is made from a second material with a lattice constant which is different from the lattice constant of the first semiconductor material. The method further comprises selectively doping the source region, the channel region, the heterosection and the drain region to a desired doping level and dopant type, depositing on sidewalls of the nanowire structure a gate dielectric and a gate electrode, and forming a drain contact on top of the drain region of the nanowire.

Different TFET integration approaches exist. They can be classified on the one hand in top-down approaches, and on the other hand in bottom-up approaches. For the known top-down approaches, the bottom junction, the intrinsic doped Si and the top diode (in situ doped Si or heterostructures) are epitaxially grown before the nanowire patterning. Complementary devices need to have an epitaxial growth in two steps: one with P-top and one with N-top. An issue with known catalyst based bottom-up approaches is metal contamination. Therefore the nanowires can be selectively grown in an oxide template (growth in holes). This means selective growth of the intrinsic Si channel in situ, followed by the growth of the heterojunction which makes the integration scheme complex for complementary devices.

SUMMARY OF THE DISCLOSURE

It is an object of embodiments of the present disclosure to provide good method for manufacturing semiconductor device structures using elongate nanostructures as nanowires.

The above objective is accomplished by a method according to the present disclosure. Corresponding devices are also provided.

In a first aspect, the present disclosure provides a method for manufacturing at least one nanowire Tunnel Field Effect Transistor (TFET) semiconductor device. The method comprises providing a stack comprising a layer of channel material with on top thereof a layer of sacrificial material, removing material from the stack so as to form at least one nanowire from the layer of channel material and the layer of sacrificial material, and replacing the sacrificial material in the at least one nanowire by heterojunction material.

The presence of heterojunction material in the at least one nanowire increases tunneling in the TFET device. A method according to embodiments of the present disclosure is advantageous as replacing the sacrificial material by heterojunction material as proposed makes the manufacturing process of the nanowire TFET semiconductor device independent from the dopant type of the nanowire.

Furthermore, in embodiments of the present disclosure only small amounts of heterojunction material are grown, thinner than the mismatch, hence the devices obtained exhibit less mismatch compared to prior art devices.

In a method according to embodiments of the present disclosure, providing a stack comprises providing a layer of crystalline channel material. Such crystalline material allows growing a capping layer later on.

A method according to embodiments of the present disclosure may furthermore comprise, after forming the at least one nanowire, embedding the at least one nanowire in insulating material.

A method according to embodiments of the present disclosure may furthermore comprise, before embedding the at least one nanowire in insulating material, covering the at least one nanowire with a capping layer. Such capping layer may provide a basis for forming a regular and uniform layer on top during further processing of the TFET device.

Covering the at least one nanowire with a capping layer may comprise providing a few atomic layers of semiconductor material, such as for example silicon.

In a method according to embodiments of the present disclosure, replacing the sacrificial material in the at least one nanowire by heterojunction material may comprise selectively etching back the sacrificial material. This is an easy and well-known process.

A method according to embodiments of the present disclosure, furthermore comprising forming a gate stack around the nanowire. This way, an all around gate may be formed.

In a method according to embodiments of the present disclosure, replacing the sacrificial material in the nanowire by heterojunction material may be performed before formation of the gate stack. This has the advantage that no gate dielectric is present at that moment in time yet, and that hence gate dielectric material is not degraded by the process of replacing the sacrificial material by heterojunction material.

In alternative embodiments, however, replacing the sacrificial material in the nanowire by heterojunction material may be performed after formation of the gate stack. In this case, the final heterojunction is not subject to as much thermal budget as in the case of provision of heterojunction first; hence less diffusion of dopants out of the heterojunction takes place.

A method according to embodiments of the present disclosure may be arranged for manufacturing at least one nanowire Tunnel Field Effect Transistor semiconductor device of a first dopant type and at least one nanowire Tunnel Field Effect Transistor semiconductor device of a second dopant type. In such case, replacing the sacrificial material in a nanowire by heterojunction material may first be performed for at least one nanowire of the first dopant type and thereafter for at least one nanowire of the second dopant type. The method according to such embodiments of the present disclosure allows for providing complementary NW-TFETs.

In a second aspect, the present disclosure provides a semiconductor device as obtained by method embodiments according to the first aspect of the present disclosure.

In a third aspect, the present disclosure provides a semiconductor device comprising at least one vertical TFET comprising a nanowire comprising channel material and a heterojunction. The nanowire is surrounded by a shell underneath the gate stack, at least at the interface between the channel material and the heterojunction. The shell may for example be a crystalline shell. The shell may for example be a silicon shell.

In a semiconductor device according to embodiments of the present disclosure, at least two vertical TFETs may be provided, at least two of the at least two vertical TFETs being of different types. A first type may be an N-type of TFET and a second type may be a P-type of TFET. Such device is a complementary device.

It is an advantage of a method for manufacturing a NW-TFET according to embodiments of the present disclosure that Si based materials and process knowledge can be used to create the NW-TFET such that the NW-TFET manufacturing can be easily processed an incorporated in current Si-based technology devices.

A manufacturing method according to embodiments of the present disclosure is distinguished from prior art manufacturing methods in that it allows processing of different dopant types of NW-TFETs (complementary TFETs) on a same substrate area.

Particular and preferred aspects of the disclosure are set out in the accompanying independent and dependent claims. Features from the dependent claims may be combined with features of the independent claims and with features of other dependent claims as appropriate and not merely as explicitly set out in the claims.

For purposes of summarizing the disclosure and the advantages achieved over the prior art, certain objects and advantages of the disclosure have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein.

Figure 1:
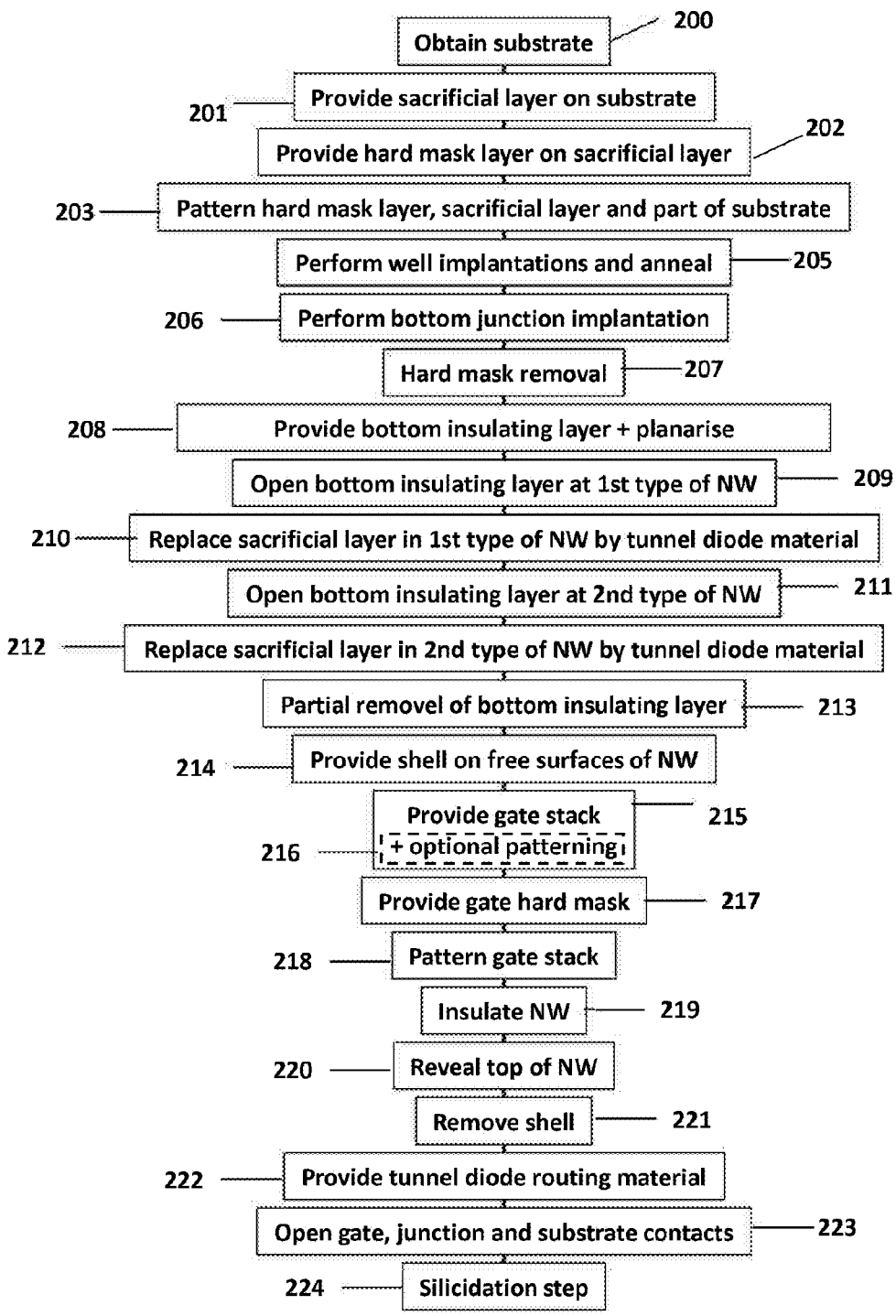
FIG. 1 is a flow chart of a method for manufacturing complementary vertical TFETs according to a first embodiment of the present disclosure.

The drawings are only schematic and are non-limiting. In the drawings, the size of some of the elements may be exaggerated and not drawn on scale for illustrative purposes.

In the different drawings, the same reference signs refer to the same or analogous elements. Any reference signs in the claims shall not be construed as limiting the scope.

DETAILED DESCRIPTION OF ILLUSTRATIVE EMBODIMENTS

The present disclosure discloses a method for manufacturing at least one nanowire Tunnel Field Effect Transistor semiconductor device. A method according to embodiments of the present disclosure comprises providing a stack comprising a layer of channel material with on top thereof a layer of sacrificial material, removing material from the stack so as to form a nanowire from the layer of channel material and the layer of sacrificial material, and replacing the sacrificial material in the nanowire by heterojunction material. Heterojunction material is semiconductor material which is different from other semiconductor material in the nanowire.

A method according to embodiments of the present disclosure thus comprises introduction of a sacrificial layer, and later on replacing this sacrificial layer by heterojunction material.

According to one embodiment of the method, complementary TFETs are manufactured, i.e. TFETs having nanowires having different dopant types. In a method according to this embodiment, the sacrificial layer is replaced after a bottom isolation layer is polished and the sacrificial layer is exposed (after CMP or after wet etchback). Next the sacrificial layer can be replaced by the heterojunctions in two steps (one step for each dopant type of nanowires):

Opening and etchback of the dummy P-tunnel diode and growth of the P-tunnel diode Opening and etchback of the dummy N-tunnel diode and growth of the N-tunnel diode According to another embodiment of the method, the TFET semiconductor devices comprising nanowires with a sacrificial layer are processed until the top isolation is defined. Next the sacrificial layer is replaced by the heterojunctions as mentioned before.

Advantages of methods according to embodiments of the present disclosure are that nanowire patterning for different dopant types of nanowire TFETs, e.g. N-TFET and P-TFET, is the same. The nanowire height is controlled, so that a same stack may be obtained for both devices. As long as the diameter $\phi_{NW}$ of the nanowires is small enough, the bottom junction can be defined by masked implants and diffusion steps.

Methods according to embodiments of the present disclosure provide a better control of the gate overlap (as much overlap as possible is best) on the tunnel junction. The channel length is controlled. A facet-free channel material may be provided to start from.

Methods according to embodiments of the present disclosure provide epitaxial growth on a damage free wafer surface, e.g. Si surface. Methods according to embodiments of the present disclosure provide less relaxation. Less problems with defects occur at the junction/channel interface due to the small exposed growth surface. The smaller the diameter of the nanowires, the less problems occur with lattice mismatch. There is a possibility to start with a crystalline hetero junction and to continue the growth with an amorphous layer to reduce the growth rate dependence on window sizes.

Whenever reference is made hereinafter to a particular dopant type, this is done for the ease of explanation only and is not intended to limit the disclosure. It is to be understood that in the examples given herein below, materials and dopant types may be replaced by other suitable materials and dopant types, without changing the disclosure.

The disclosure will now be described by a detailed description of several embodiments of the disclosure. It is clear that other embodiments of the disclosure can be configured according to the knowledge of persons skilled in the art without departing from the true spirit or technical teaching of the disclosure, the disclosure being limited only by the terms of the appended claims. In particular, the embodiments of the disclosure will be described with reference to nanowires, however, this is not intended to limit the disclosure, and this wording is intended to encompass any example of an elongate nanostructure, which may include nanorods, nanowhiskers and other elongated substantially cylindrical or polygonal structures having a longitudinal axis.

A method according to a first embodiment of the present disclosure is schematically illustrated in a flowchart shown in FIG. 1 and is described in detail below. It has, however, to be understood that this is only an example of a suitable method for forming a device according to the disclosure, and that the sequence of the process steps as described hereinafter is not limiting the disclosure.

The method according to the first embodiment discloses the creation of a tunnel field effect transistor (TFET) having at least one nanowire (also referred to as NW-TFET), the nanowire comprising the channel region, source/drain regions, here called bottom and top junctions, and a heterosection. The heterosection is situated in between the channel region and one of the source/drain regions.

In a first step 200, a substrate 20 is provided. Preferably the substrate 20 is a semiconductor substrate. In particular embodiments, the substrate can for example be a silicon substrate, a substrate of a group IV material, a substrate of a III/V material or a silicon on insulator (SOI) substrate. The semiconductor substrate 20, e.g. silicon substrate, may be intrinsic to lowly doped with a particular dopant type, e.g. p-type doped (for example B-doped). As an example, the doping level of the substrate 20 may be in the range of intrinsic to $10^{16}$/cc doping. In particular embodiments, the doping level of the substrate 20 may be in the range of intrinsic up to $10^{14}$/cc doping. The doping can be performed during provision of the substrate material (e.g. by adding appropriate doping gases during growth of the substrate material), or after provision of the substrate material. The semiconductor substrate 20 may have any suitable thickness for providing the nanowire channel and bottom junction region for the NW-TFET structure to be provided on the substrate 20, for example between 20 nm and 750 µm.

On top of a major surface of the substrate 20, a sacrificial layer 21 is provided (step 201). The sacrificial layer can be made of any suitable material which is selectively removable towards the underlying substrate 20, and towards a hardmask 22 to be provided on top thereof. The sacrificial layer 21 may have a thickness which is at least sufficient to isolate the source contact from the gate and still have a gate overlap, for example a thickness of about 120 nm. The sacrificial layer 21 can for example comprise or consist of amorphous semiconductor material, for example amorphous SiGe. SiGe may be particularly good as a semiconductor material to be applied on a silicon substrate 20, in view of its being able to be manufactured on silicon wafers using conventional silicon processing toolsets and its being able to be etched selectively towards Si and $SiO_2$.

The substrate 20 and the sacrificial layer 21 together form a stack 24.

A hardmask layer 22 is provided (step 202) on the stack 24. The hardmask layer 22 may for example consist of a material suitable for being used during lithography (patterning), such as for example low temperature oxide or nitride. The hardmask layer 22 may be deposited on the sacrificial layer 21. The hardmask layer 22 is provided for later on patterning the underlying substrate 20 and sacrificial layer 21. The hardmask layer 22 may have a thickness suitable to protect the underlying sacrificial layer during further processing, hence a thickness which may depend on the thickness of the sacrificial layer, for example a thickness in the range of 1 nm up to 100 nm.

Figure 2:
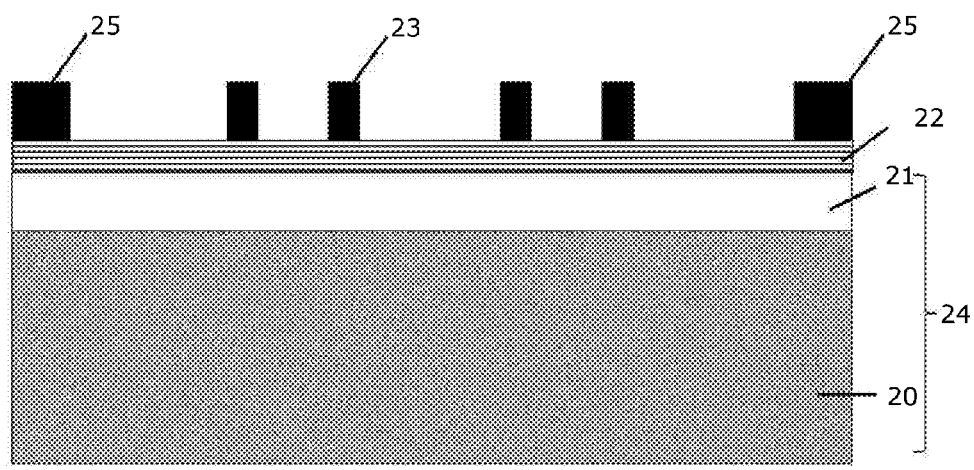
FIG. 2 to FIG. 17 illustrate subsequent process steps in a manufacturing method according to the first embodiment of the present disclosure.

In a next step 203, the hardmask layer 22, the sacrificial layer 21 and the substrate 20 are patterned. This may be obtained by, on the hard mask 22, providing a layer arranged for patterning the underlying layers, for example by spin-coating. The layer arranged for patterning the underlying layers may be a resist layer. The layer arranged for patterning the underlying layers may itself be patterned, e.g. via lithography, to form a nanometerscale temporary mask 23 that protects selected areas of the underlying layers 20, 21 during subsequent process steps. In the particular method illustrated, some of the selected areas protected by the mask 23 are the areas where later during the process nanowires will be formed. Other areas of the mask 23, indicated by features 25 in FIG. 2, are provided to ensure proper flatness after CMP.

Figure 3:
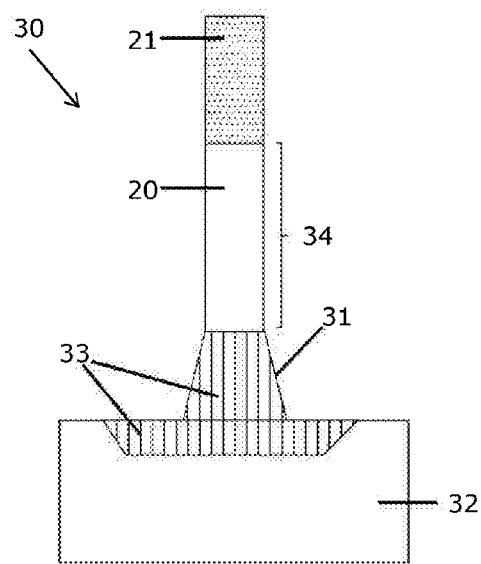

The mask 23 is then used for processing the layers underneath the mask 23: the hard mask 22, the sacrificial layer 21 and the substrate 20. The hard mask 22 and the sacrificial layer 21 as well as part of the substrate 20 are removed by any suitable method from locations where no mask features 23 are present, for example by dry etching, thus forming at least one nanowire 30 on the remainder part of the substrate 20. The thus formed at least one nanowire 30 may have a sloped bottom profile 31, as illustrated in FIG. 3. Such sloped bottom profile 31 may improve the stability of the nanowire 30. The diameter of the nanowire 30 may be between 1 and 500 nm, e.g. between 2 and 200 nm, and the length of the nanowire may be between 5 nm and 2 μm, e.g. between 10 nm and 1 μm, depending on the thicknesses of the material layers and the depth of the etch in the substrate 20. After formation of the at least one nanowire 30, well implantations (step 205) may be performed underneath the at least one nanowire 30, so as to form in the substrate 20 a well 32 of a particular dopant type. Different types of wells 32 may be formed in the substrate 20. For example, a well 32 of a first dopant type (e.g. N-type well) may be provided in the substrate 20 where a nanowire 30 with a bottom junction of a second dopant type (P-type) is to be provided, or a well of a second dopant type (e.g. P-type well) may be provided in the substrate 20 where a nanowire 30 with a bottom junction 33 of a first type (N-type) is to be provided. Suitable masks and suitable dopant elements may be used for performing the well implantations, so that first one or more wells 32a of a first dopant type and thereafter one or more wells 32b of a second dopant type may be formed (or vice versa)—see also FIG. 4. After the well implantations have been performed, an anneal may take place for diffusing the dopant atoms into substitutional positions in the crystal lattice.

In the formed well 32 and at the bottom of the nanowire 30 a bottom junction implantation is performed (step 206) with a particular dopant type, for forming the bottom junction 33 of the nanowire 30. The dopant type is different from the dopant type of the well 32 in which the bottom junction 33 is formed. The dopant type used for the bottom junction 33 determines the device type (mode of operation). The dopant level of the bottom junction 33 is high, for example in the range of $10^{18}$/cc to $10^{21}$/cc. In particular embodiments, the doping level of the bottom junction 33 is in the range of $10^{19}$/cc to $5 \cdot 10^{20}$/cc. Suitable masks and suitable dopant elements may be used for performing the bottom junction implantations. After the implantations have been performed, an anneal may take place for diffusing the dopant atoms into substitutional positions in the crystal lattice and under the nanowire.

Both the well implantations and the bottom junction implantations may be performed under 0° tilt. In that case, the hard mask 22 and the sacrificial layer 21 protect the channel 34 formed by the substrate 20 material of the nanowire 30 during implantation.

Optionally, for increased protection, and not illustrated in the drawings, the implantations may be performed after the deposition of a protection layer, for example an oxide layer, on the channel 34 of the nanowire 30, to avoid implantation of species in the channel 34. Alternatively, implantation may be performed in the presence of a post etch curing oxide. Such post etch curing oxide stops implantation of dopants into the channel 34, cures possible defects to get rid of etch damage and smoothes the sidewalls of the channel 34. The resulting structure is illustrated in FIG. 3.

After the implantations of the well 32 and the bottom junction 33, the hard mask 22 is removed (step 207), for example by etching back or by resist stripping, e.g. in-situ removal takes place.

In a next step 208, a bottom insulating layer 40 is provided around the at least one nanowire 30, and between the nanowires 30 if a plurality of these have been provided. This way, the one or more nanowires 30 are embedded in the insulating layer 40. This insulating layer 40 insulates the nanowires 30 from one another. The bottom insulating layer 40 may comprise or consist of oxide, such as for example low-k oxide, HDP oxide or another suitable insulating material, for example conformally deposited insulating materials. The sloped bottom profile 31 of the nanowires 30a, 30b may be beneficial for trench filling, as it allows an easier filling of the space between the nanowires. Furthermore, the sloped bottom profile 31 of the nanowires 30a, 30b gives rise to good mechanical stability.

The bottom insulating layer 40 is planarized, for example by CMP, stopping on the nanowires 30. Alternatively, the bottom insulating layer 40 may be planarized to a level above the nanowires 30, and further etched back down to the level of the top of the nanowires 30

Figure 4:
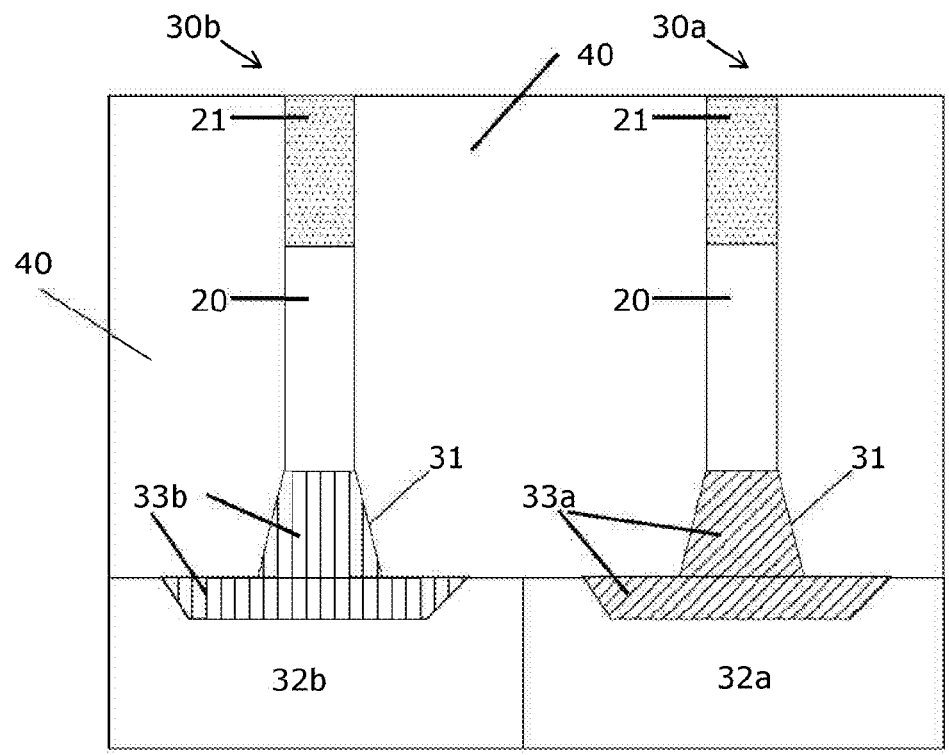

The result of provision of bottom insulating material 40 around the at least one nanowire and planarization thereof is illustrated in FIG. 4 for a particular case of two nanowires 30a, 30b of different types, provided respectively above wells 32a, 32b of different types and having bottom junctions 33a, 33b of different types. In FIG. 4, an embodiment is illustrated in which during previous steps a P-well 32a and an N-well 32b are provided. The formed bottom junctions are an N$^+$-junction 33a at the bottom of the nanowire 30a on the P-well 32a, and a P$^+$-junction 33b at the bottom of the nanowire 30b on the N-well 32b.

Figure 5:
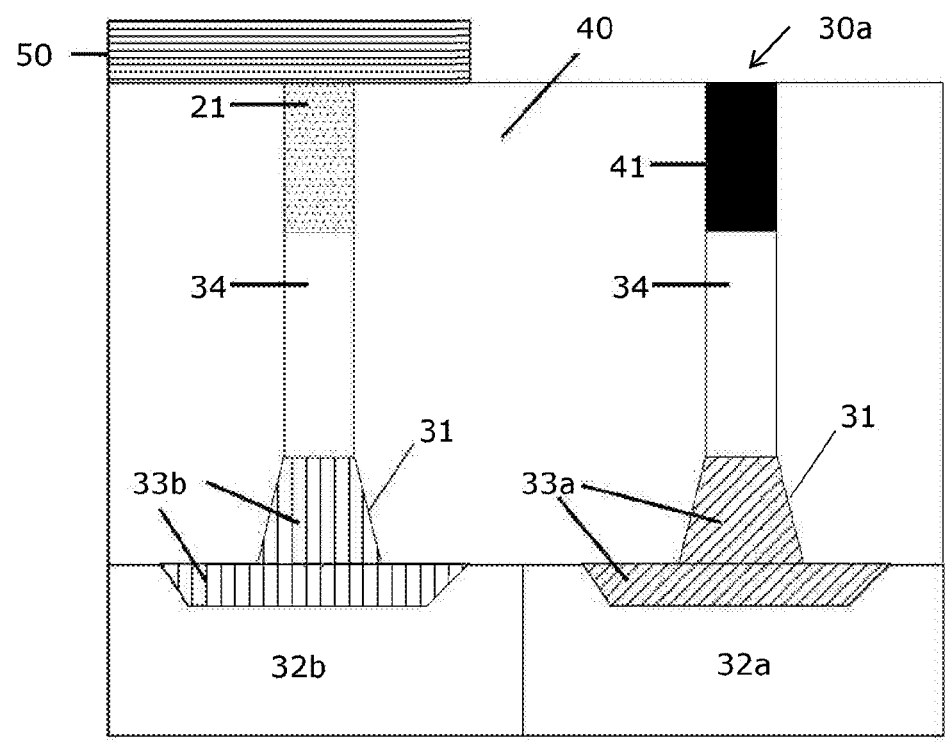

After planarization of the insulating layer 40 and possible etchback, this layer 40 may be opened (step 209) at the level of a first type of tunnel junction (in practice this may be at the level of one or more nanowires of a first type), in the embodiment illustrated at the level of the right hand nanowire 30a, provided above the N$^+$-junction 33a in the P-well 32a. For this opening of the insulating layer 40, a protection material 50, for example a protection oxide, may be provided and resist patterning may be used, which may be based on a same reticle as the one for the bottom junction implantation for forming the bottom junction(s) 33a. The thus provided resist mask may be used for opening the insulating layer 40, as illustrated at the right hand side of FIG. 5, at the level of one or more nanowires 30 of a particular type.

In a next step 210 after opening of the insulating layer 40, the sacrificial layer 21 in the nanowire 30a which is revealed by opening the insulating layer 40, is removed by an appropriate selective removal mechanism, for example a selective etchback of the sacrificial layer material, e.g. α-SiGe, towards the material of the channel 34, e.g. i-Si, and the material of the insulating layer 40, e.g. oxide. The obtained hole is filed, e.g. by in-situ deposition, with suitable tunnel diode material 41 of a first type, e.g. P+ doped c-SiGe. In particular embodiments, the tunnel diode material 41 is $Si_{1-x}Ge_x$ with x>0.5. In particular embodiments of the present disclosure, the steps of removal of the sacrificial layer 21 and provision of the tunnel diode material 41 can be performed in one step in an epireactor. The doping level of the tunnel diode material 41 is high, for example in the range of $10^{18}$/cc to $10^{21}$/cc. In particular embodiments of the present disclosure, the doping level may be in the range of $10^{19}$/cc to $5 \times 10^{20}$/cc. The doping level of the tunnel diode material 41 may be higher than the doping level of the bottom junction 33a.

Figure 6:
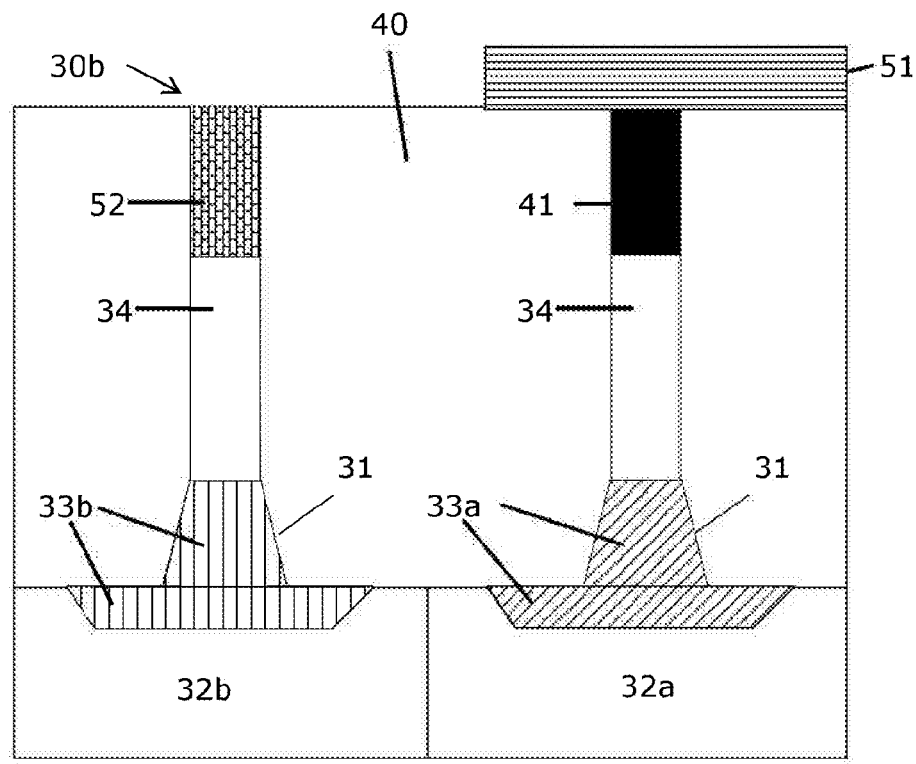
Figure 7:
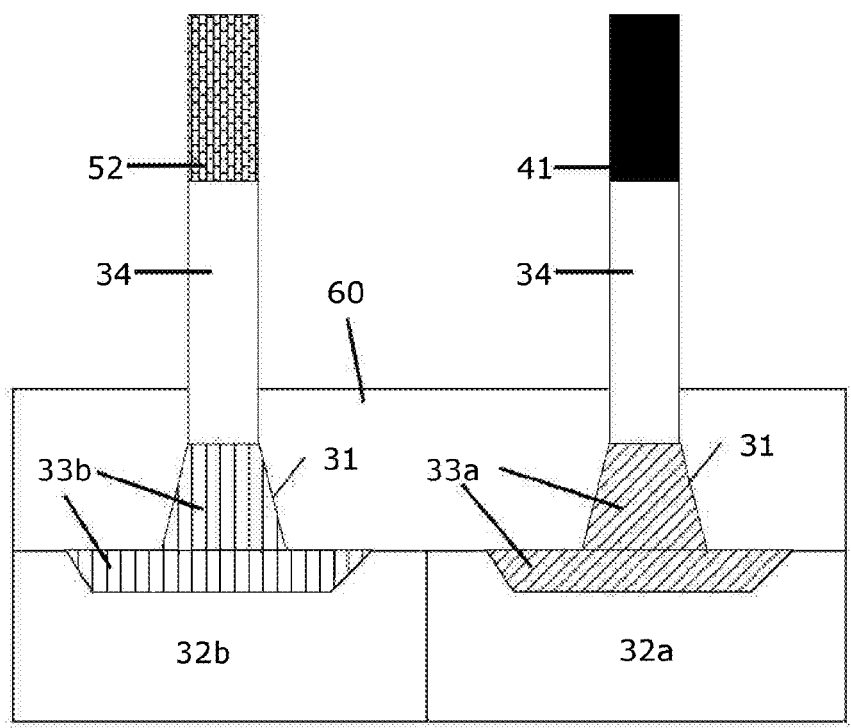

In a next step 211, after formation of the first tunnel junction 41, a protection material 51, for example a protection oxide is provided, e.g. deposited, on this first tunnel junction 41. The insulating layer 40 is then opened at the level of a second type of tunnel junction, in the embodiment illustrated at the level of the left hand nanowire 30b, provided above the P$^+$-junction 33b. For this opening of the insulating layer 40, resist patterning may be used, which may be based on a same reticle as the one for the bottom P$^+$-junction implantation 33b. The thus provided resist mask may be used for opening the insulating layer 40, as illustrated at the left hand side of FIG. 6, at the level of one or more nanowires 30 of a particular type.

In a next step 212, after opening the insulating layer 40, the sacrificial layer 21 in the nanowire 30b which is revealed by opening the insulating layer 40, is removed by an appropriate selective removal mechanism, for example a selective etchback of the sacrificial layer material, e.g. α-SiGe, towards the material of the channel 34, e.g. i-Si, and the insulating layer material 40, e.g. oxide. The obtained hole is filed, e.g. by in-situ deposition, with suitable tunnel diode material 52 of a second type, e.g. N+ doped c-III/V material, e.g. In, Ga, As, Sb, Al, P, B, N and binary, tertiary and quaternary compounds thereof. In particular embodiments of the present disclosure, the steps of removal of the sacrificial layer 21 and provision of the tunnel diode material 52 can be performed in one step in an epireactor. The doping level of the tunnel diode material 52 is high, for example in the range of $10^{18}$/cc to $10^{21}$/cc. In particular embodiments of the present disclosure, the doping level may be in the range of $10^{19}$/cc to $5 \times 10^{20}$/cc. The doping level of the tunnel diode material 52 may be higher than the doping level of the bottom junction 33*b*.

It is an advantage of embodiments of the present disclosure that, in case of complementary TFETs, first a first type of nanowires 30*a* can be opened and thereafter a second type of nanowires 30*b*. This way, different processing can be performed for different types of nanowires 30*a*, 30*b*. This is different from blanket type processing where no choice of different materials is possible.

After provision of the tunnel diode material 41, 52 for the different types of nanowires 30, the bottom insulating layer 40 is partially removed (step 213), e.g. etched back. Such removal is selective towards the channel material 34, e.g. i-Si, and the P and N-type material 41, 52 of the top junction, e.g. c-SiGe and C-III/V material, respectively. The amount of insulating layer material 40 which is left after the partial removal forms the bottom insulation 60. The thickness of the bottom insulation 60 determines the intrinsic channel length outside the gate region which is needed to suppress the parasitic gate capacitance, to avoid gate leakage, to suppress the ambipolar behavior of the device, and to keep the intrinsic Si channel outside the gate region as short as possible for reduction of the sheet resistance.

Figure 8:
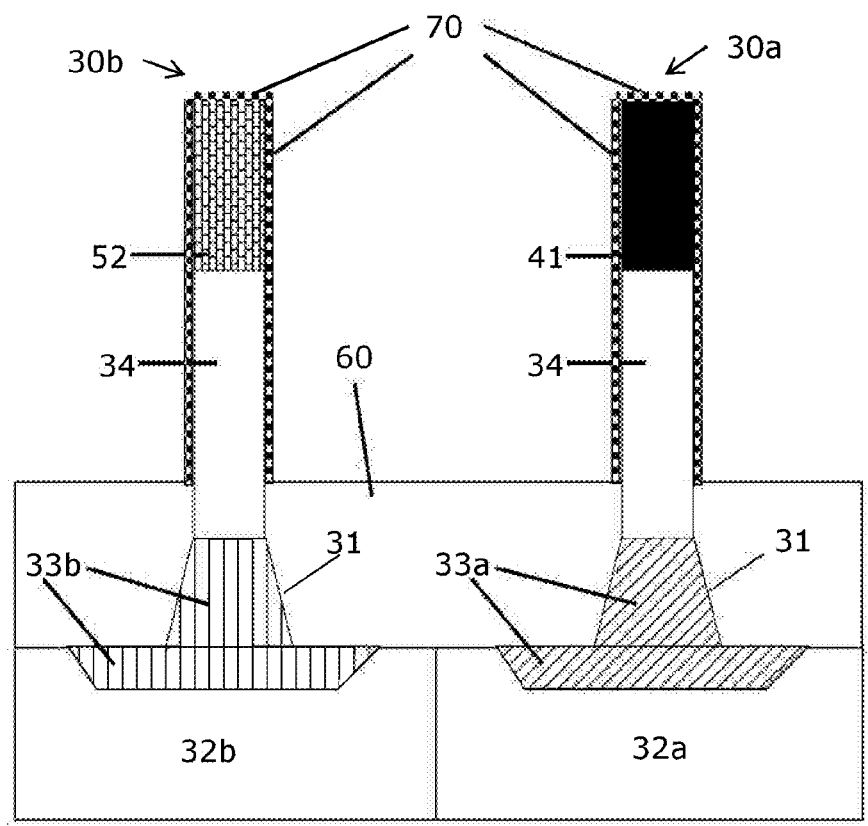

After providing the suitable thickness of bottom insulation 60, a thin crystalline shell 70 is grown (step 214) around the exposed nanowires, e.g. Si/SiGe nanowires, as illustrated in FIG. 8. The shell 70 is provided on all free surfaces of the formed nanowires 30*a*, 30*b* and functions as a passivation layer for the heterojunction. The shell 70 can have a thickness of about 1 to 3 nm, preferably a thickness of only a few mono layers. The shell material depends on the channel and heterojunction materials, as the shell 70 has to be compatible with both. In the embodiments illustrated, Si is a possible candidate material for the shell 70, in view of the channel being made from i-Si and the heterojunction being made from either c-SiGe or C-III/V material. An advantage of providing such shell 70 is that a regular and uniform layer may be grown on top thereof, over the junction. The shell 70 avoids surface dependent gate dielectric quality in the gate overlap region on the heterojunction. The shell 70 thickness may be optimized taking into account the consumption of the shell material during the next processing steps of the integration flow (the shell 70 has to withstand the next steps), and the electrical effect of its presence underneath the gate stack.

Figure 9:
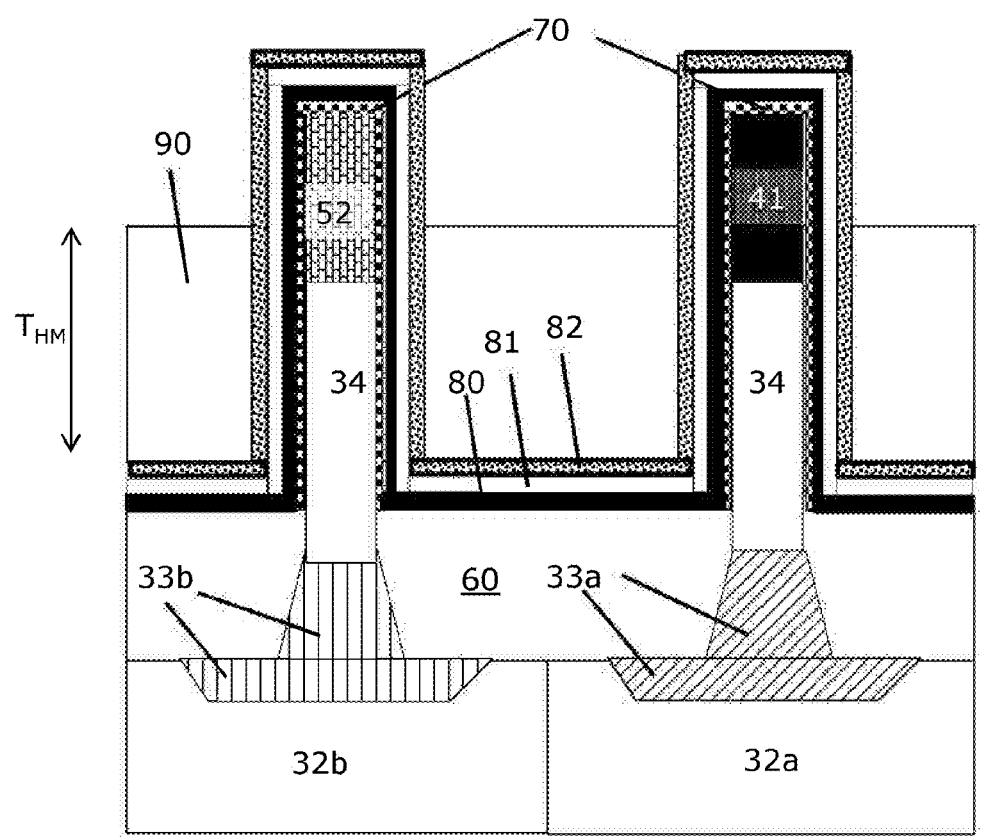

In a next step 215, a gate stack may be provided onto the sidewalls of the channel 34 of the nanowires 30*a*, 30*b* and patterned, as illustrated in FIG. 9. Such gate stack may comprise a high-k dielectric layer 80, e.g. a high-k oxide such as hafnium oxide, which is provided on the shell 70 and optionally partly also on the bottom insulation 60. The thickness of the high-k dielectric layer 80 may be in the range of 0.5 nm to 20 nm. The gate dielectric 80 covers the outer walls of the channel 34. On top of the high-k dielectric layer 80, a metal gate 81 is provided. This metal gate 81 determines the workfunction of the TFET. Suitable metals for forming the metal gate 81 may be Al, W, Ta, Ti, Ru, Pd, Rh, Re, Pt and alloys thereof. On top of the metal gate 81, a layer of a suitable material for later on forming a low resistive metal contact is provided, e.g. an amorphous semiconductor layer, for example an a-Si layer 82, as used in CMOS for electrically contacting the metal gate 81. The thickness of the a-Si layer 82 is optimized for a pre-determined silicide thickness to be obtained later during the process. The complete gate stack, i.e. the high-k dielectric layer 80, the metal gate 81 and the a-Si layer 82 have a thickness such that the total stack thickness determines the minimum gate length.

After providing the gate stack 80, 81, 82, it may optionally be patterned (step 216) for separating the different gate stacks from one another (not illustrated in the drawings). This patterning may be performed by means of a resist masked dry etch of the gate stack 80, 81, 82 in an isotropic way. In particular embodiments, the patterning is such that gate stacks of nanowires of different type are not electrically connected to each other. This patterning is such that the metal gate 81 does not extend over the dielectric layer 80, hence is not in direct contact with any of the shell 70 or the bottom insulation 60. The gate structure comprising gate dielectric 80 and metal gate 81 can be referred to as an all around gate structure.

Patterning of the gate stack for separation of the gates does not need to be performed immediately after the gate stack deposition; it can also be done later. However, patterning the gate stack immediately after deposition thereof avoids problems near the dummy structures for CMP.

In a next step 217, a gate hard mask 90 is provided over the gate stack. This gate hard mask 90 may for example be an oxide layer, e.g. a HDP oxide. The material of the gate hard mask may be different from the material of the bottom insulation layer 60. The provided gate hard mask 90 is planarised, for example by a mechanical planarization method such as e.g. CMP, followed by an etch back step for removing part of the gate hard mask material around the nanowires, so as to reveal the top of the nanowires as illustrated in FIG. 9. The thickness $T_{HM}$ of the remaining hard mask 90 must be sufficient to guarantee that the gate stack 80, 81, 82 after patterning using the hard mask 90 overlaps on the tunnel junction formed between the channel 34 and the tunnel diode material 41, 52.

Figure 10:
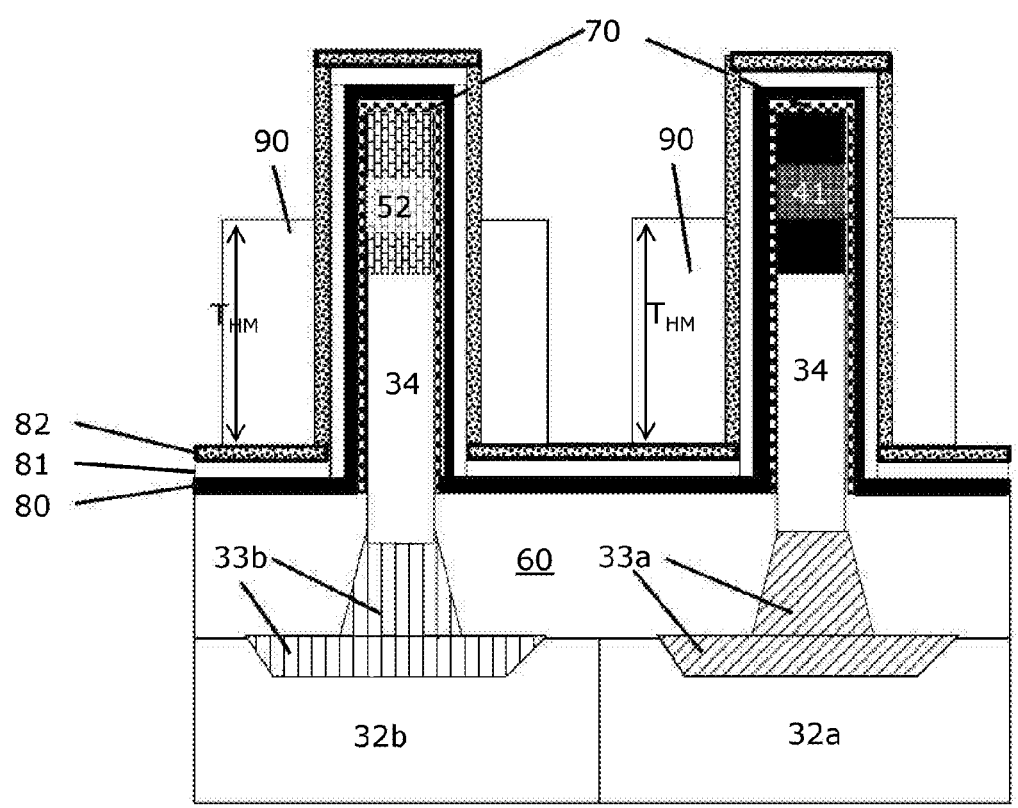

If the gate stack 80, 81, 82 has not been patterned for separation in step 216, the gate hard mask 90 is furthermore patterned so as to reveal parts of the gate stack 80, 81, 82 where gates of different nanowires need to be separated. This is illustrated in FIG. 10.

Figure 11:
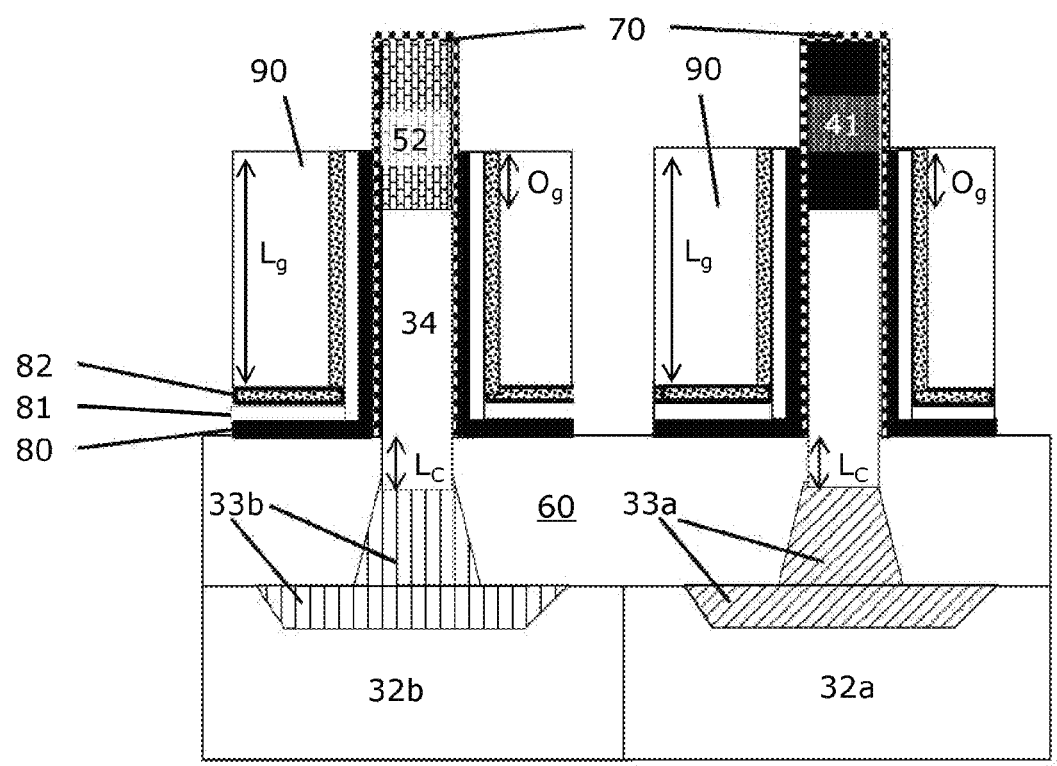

The gate hard mask 90 is used in a next step 218 as a hard mask to pattern the gate stack 80, 81, 82. This is illustrated in FIG. 11. The patterning of the gate stack 80, 81, 82 comprises subsequent removal steps of the revealed part of a-Si layer 82, of the revealed part of the metal layer 81 and of the revealed part of the high-k dielectric layer 80. By patterning the gate stack 80, 81, 82 part of the shell 70 is revealed. If the shell 70 is a Si shell, standard CMOS recipes can be used during further processing.

By the patterning of the gate stack 80, 81, 81 using the gate hard mask 90, the gate length Lg is defined, which corresponds to the thickness $T_{HM}$ of the hard mask 90. Moreover, the thickness $T_{HM}$ of the hard mask 90 defines the gate overlap $O_g$, i.e. the length the gate overlaps the tunnel diode material 41, 52. The length of the gate overlap $O_g$, determines the amount of tunneling.

The sloped bottom profile 31 of the nanowire 30 reduces the series resistance and the length Lc of the channel 34 between the gate stack 80, 81, 82 and bottom junctions 33a, 33b while maintaining sufficient distance between the gate stack 80, 81, 82 and the bottom junctions 33a, 33b in the substrate 20 or well 32, thus reducing the parasitic gate capacitance to the bottom junction 33.

Figure 12:
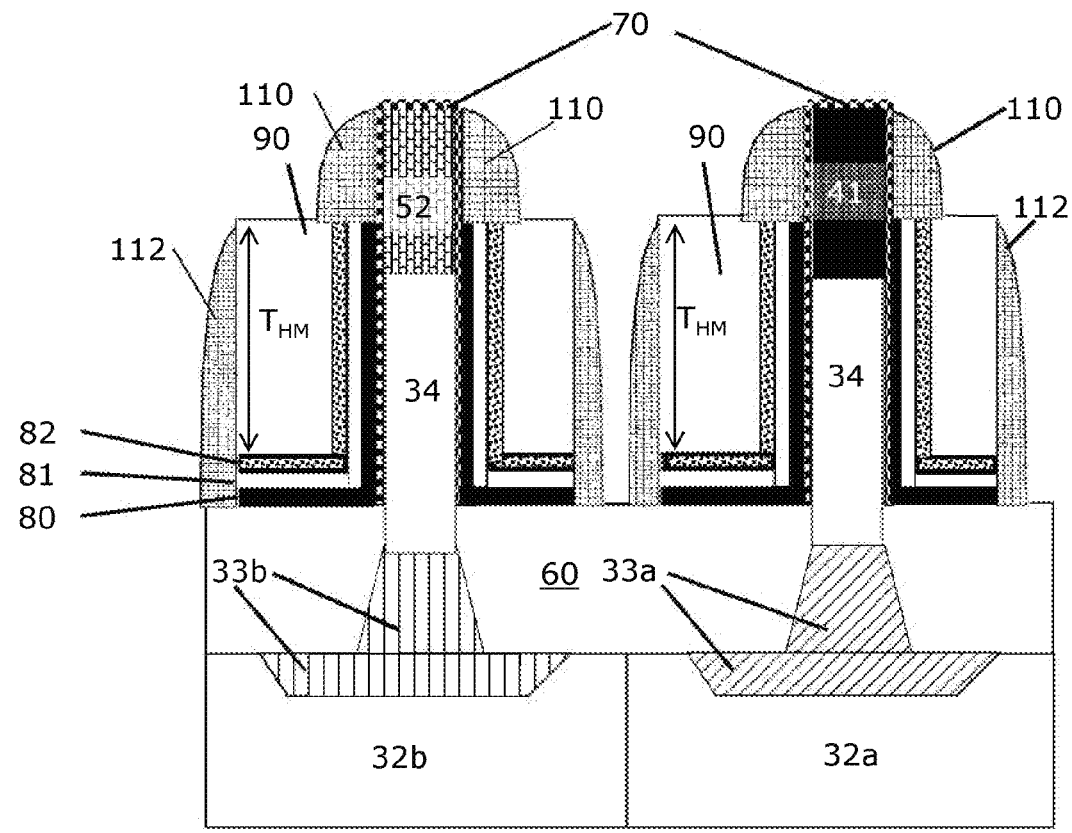

After patterning the gate stack 80, 81, 82, the revealed part of the nanowires is insulated (step 219). This may optionally be done by first providing insulation spacers 110 against the sidewalls of the revealed parts of the nanowires, as illustrated in FIG. 12. Further insulating spacers 112 may also be formed at the sidewalls of the gate hard mask 90. The spacers 110, 112 may for example be formed by blanket deposition of an insulation layer material, for example SiN, and removing a portion of the insulation layer material so that spacers 110 are formed on the sidewalls of the revealed part of the nanowire and spacers 112 are formed on the sidewalls of the gate hard mask 90. Removing a portion of the insulation layer material may be done by etching the insulation layer material. The insulating spacers 110 are not strictly necessary for insulating the revealed part of the nanowires. Top isolation without spacers 110 is possible in accordance with embodiments of the present disclosure. Nevertheless, the optional spacers 110 are advantageous for avoiding cross contamination of the metal gate. Furthermore, the insulation spacers 110 may also be used as a stressor layer for strain engineering. Strain engineering leads to bandgap variation, which may provide tunneling efficiency tuning.

Figure 13:
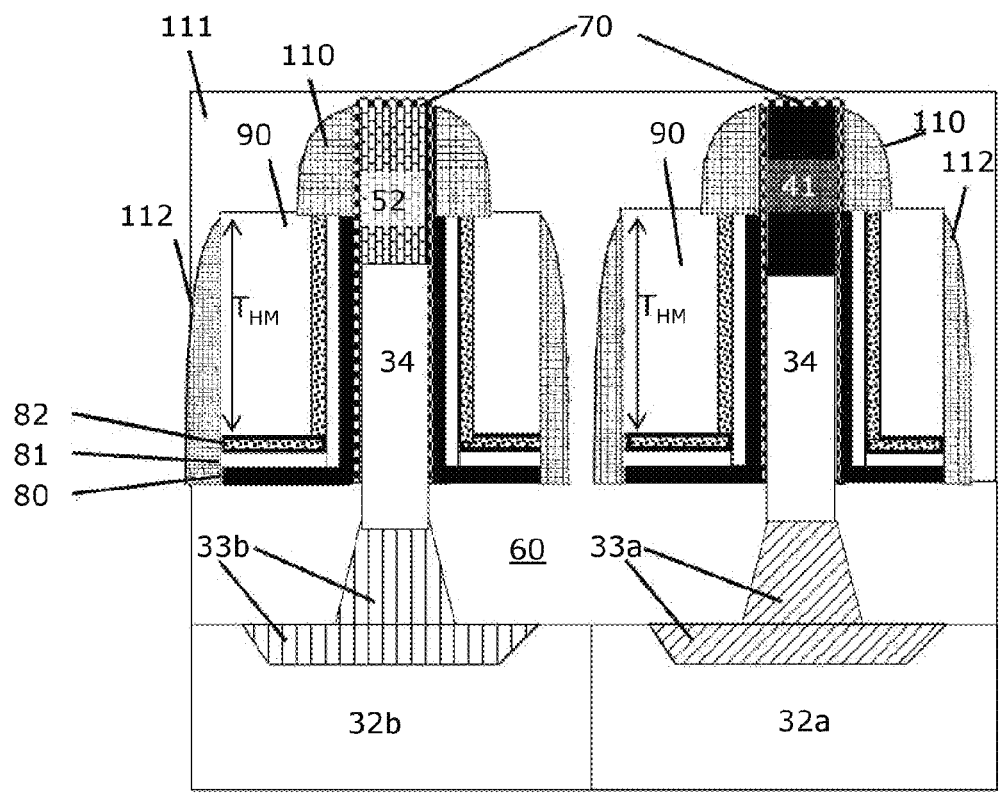

On top of or instead of the insulation spacers 110, 112 a further insulation layer 111 may be provided over the gate hard mask 90, the insulation spacers 110, 112 and the revealed parts of the nanowires. The further insulation layer 111 may be deposited. It may comprise or consist of for example HDP oxide. Once provided, e.g. deposited, the further insulation layer 111 may be planarized, for example in a mechanical planarization step such as CMP, and an insulating material etch back may be performed so as to reveal the top of the nanowires (step 220). This is illustrated in FIG. 13. The further insulation material 111 may be different from the gate hard mask material 90, but should be compatible with etching and cleaning chemistry used during future opening of contact regions.

The thickness of the insulation is determined by the insulating properties to be obtained, and should be sufficient to suppress leakage between source and drain, and to suppress a capacitance formed between gate and source.

Figure 14:
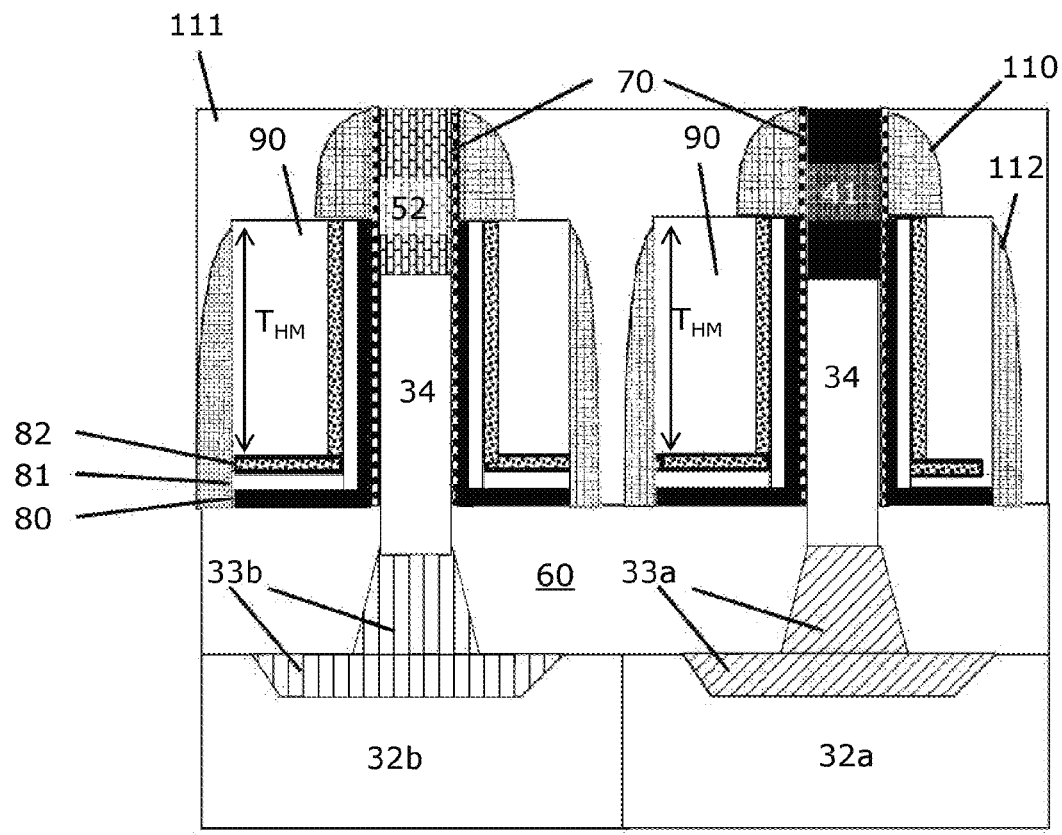
Figure 15:
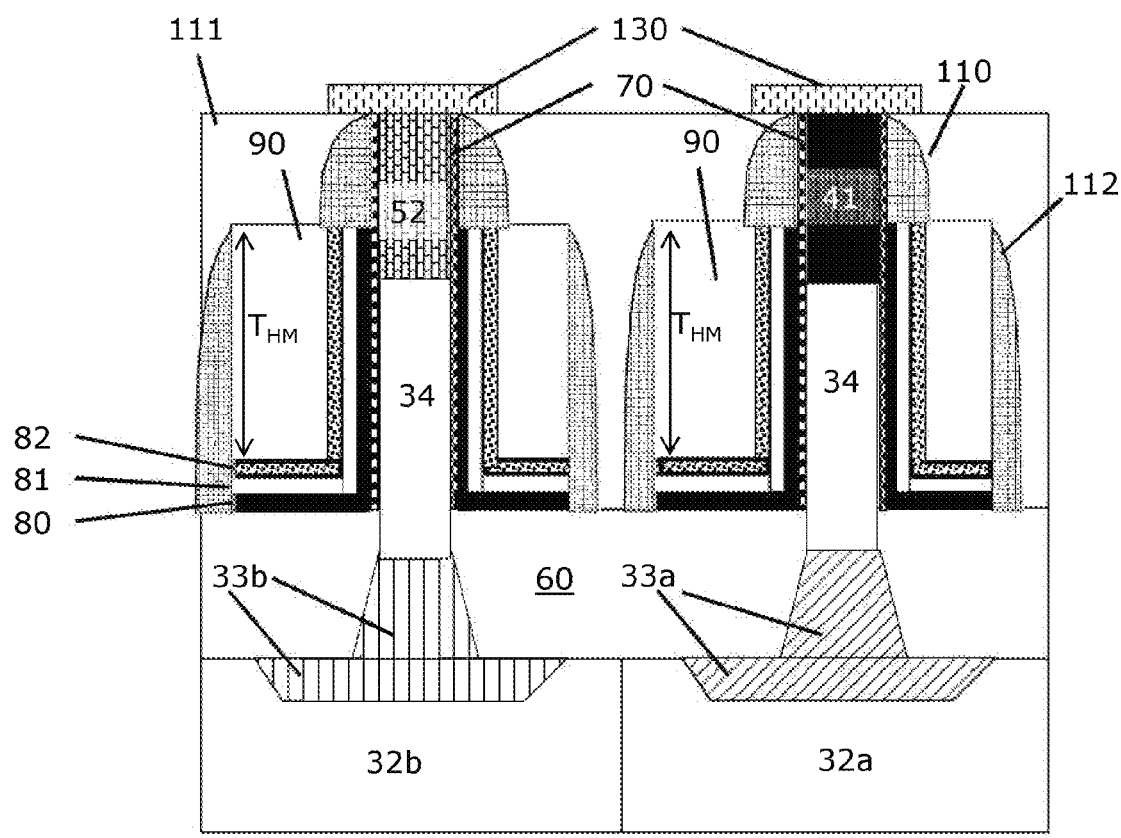

After revealing the top of the nanowires 30, the shell 70 is removed from the top of the nanowires 30 (step 221), e.g. etched back, so as to reveal the tunnel diode material 41, 52 of the nanowires—see FIG. 14. Tunnel diode routing material 130 may be applied (step 222), as illustrated in FIG. 15, for electrically contacting to the tunnel diode material 41, 52 of the nanowires. The tunnel diode routing material 130 may be conductive material such as for example highly doped a-Si material, e.g. with a doping level in the range of $10^{18}$/cc to $10^{21}$/cc, which may for example be deposited. The diode routing material 130 may have an optimized thickness so that it can be silicided, optionally fully silicided, later on.

Before providing, e.g. depositing, the tunnel diode routing material 130, a pre-treatment may be performed to ensure a good contact between the routing material 130 and the nanowire. The pre-treatment may for example be a HF-based pre-treatment.

The tunnel diode routing material 130 may be patterned in a conventional way, e.g. by a resist based patterning step. The patterned tunnel diode routing material 130 provides a routing for electrically contacting the nanowires.

Figure 16:
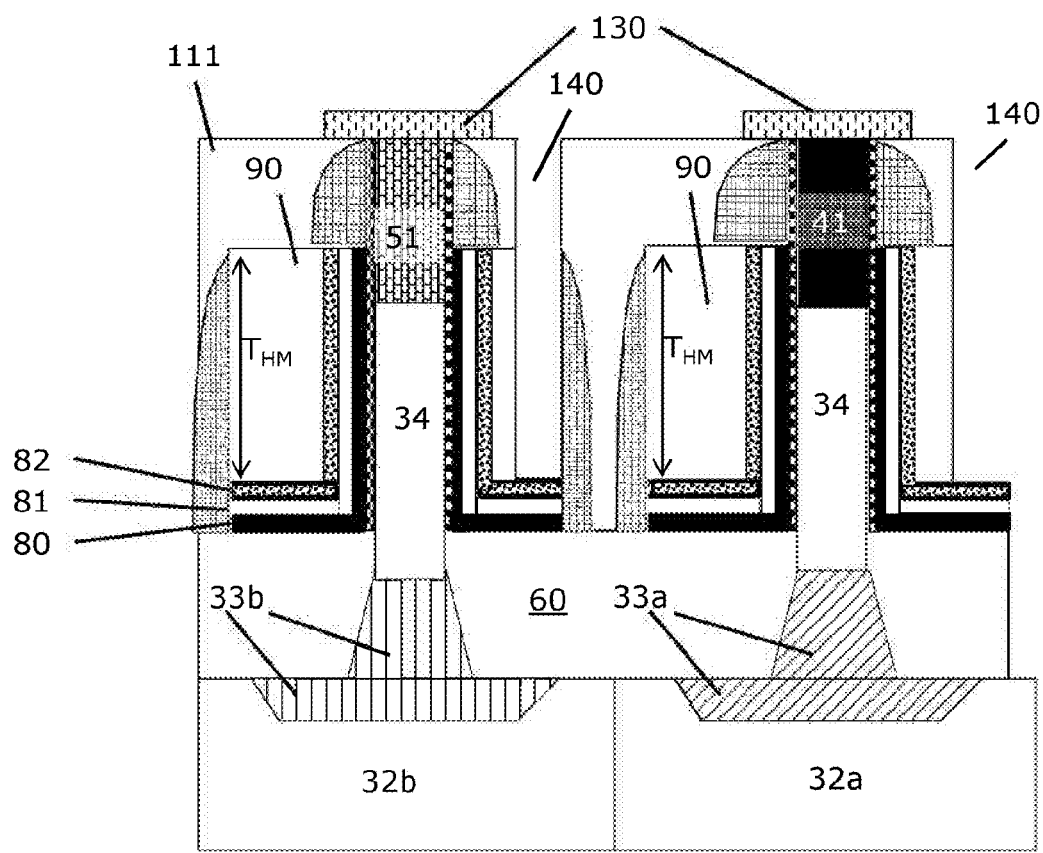

In the embodiment according to a first embodiment of the present disclosure which is illustrated in the drawings, after providing and patterning the tunnel diode routing material 130, the gate, junction and substrate contacts are opened (step 223). This is illustrated in FIG. 16. In order to open these contacts, a resist layer may be applied on top of the structure of FIG. 15. This resist layer may be patterned so that it covers and protects the tunnel diode routing material 130, but provides the possibility to create openings towards the contact regions of the bottom junctions, the substrate and the gate. Only openings 140 towards the gate and partially towards a substrate contact region is demonstrated in the process scheme illustrated. Common gate/substrate or gate/junction openings do not form a problem since the bottom isolation will separate them.

Figure 17:
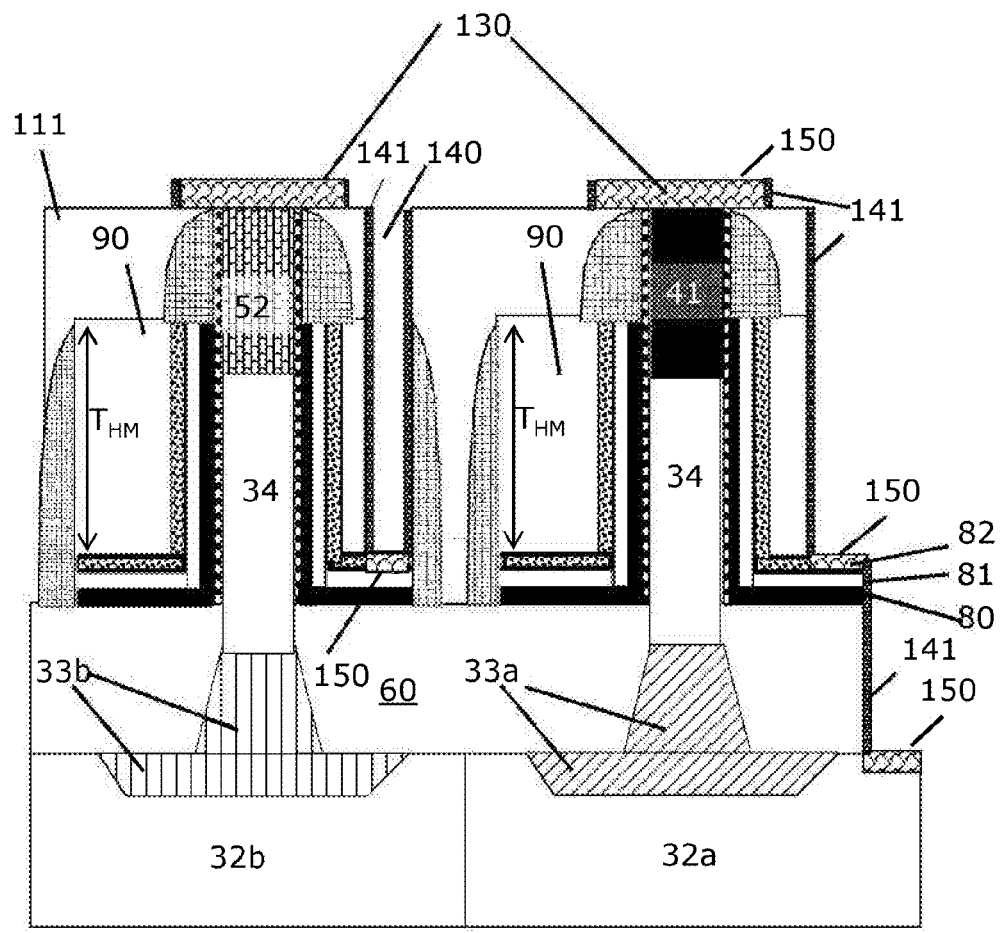

The resist layer (not illustrated in FIG. 16) is then used for creating the openings 140, for example by etching. The sidewalls of the openings 140 may be protected by forming protective spacers 141 on these sidewalls, as illustrated in FIG. 17. This may be performed for example by deposition of protective material layer, for example SiN, and removing a portion of the protective material layer so that the spacers 141 are formed on the sidewalls of the formed openings 140. Removing a portion of the protective material layer may be done by etching the protective material layer. Alternatively, rather than providing spacers 141, a thin conformal layer may be deposited of which the thickness is taken into account during a soft sputter etch. This latter solution is less complex than providing spacers.

After having provided the openings 140 towards the contact regions of the bottom junctions, the substrate and the gate, a silicidation step (step 224) is carried out for silicidation of the silicon material at the contact regions. The silicidation step may be performed by providing metal onto the revealed silicon contact regions and making both react with one another in a conventional way. FIG. 17 illustrates the device after silicide formation on the contact regions.

After silicidation of the contact regions, the openings 140 may be refilled with filler material (not illustrated in FIG. 17), for example with an oxide or a conventional BEOL stack. The oxide may be deposited. The filler material may be planarized so as to obtain a planar structure.

Further processing of the semiconductor device thus obtained may be conform with the standard back end of line CMOS processing.

Figure 18:
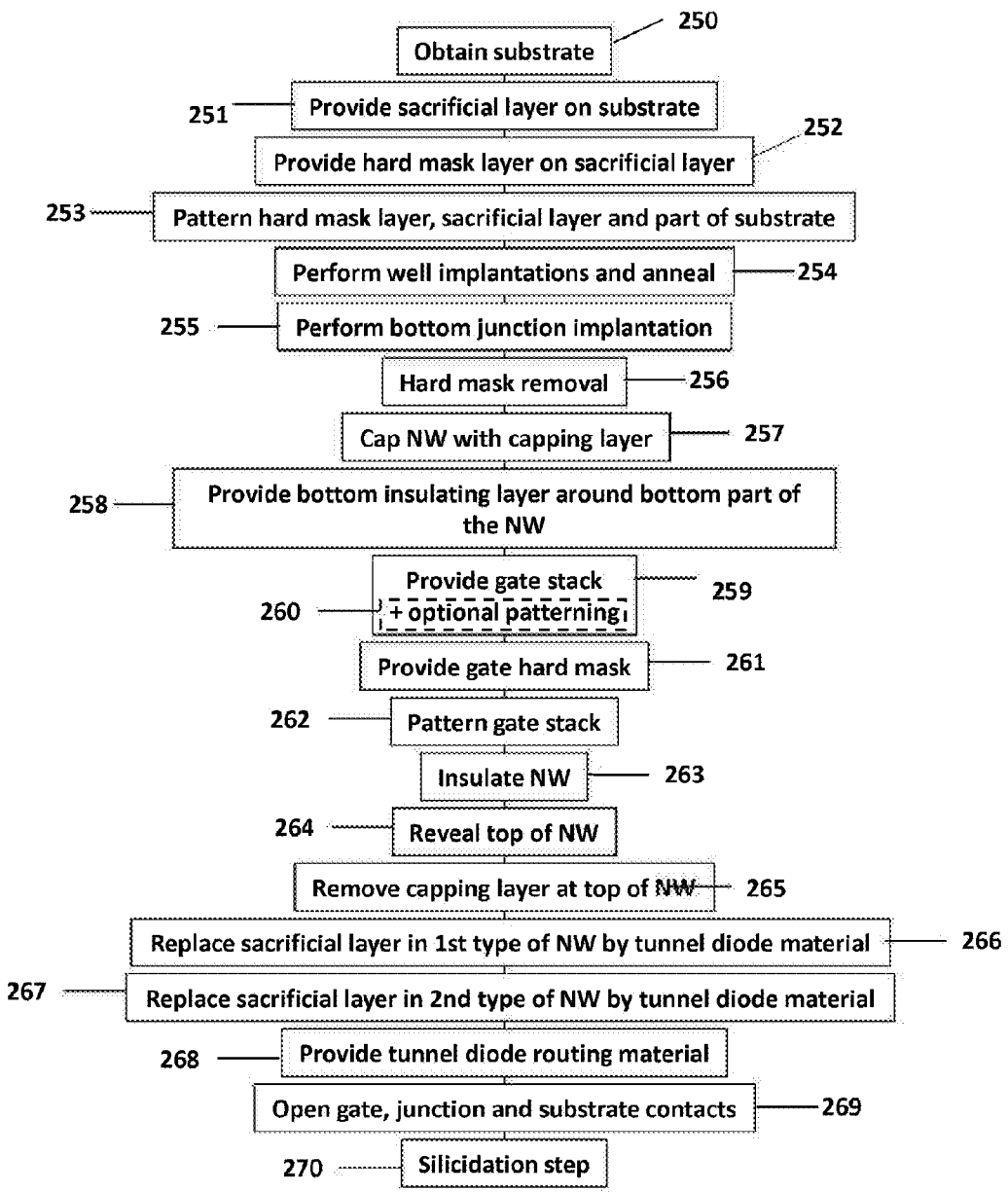
FIG. 18 is a flow chart of a method for manufacturing complementary vertical TFETs according to a second embodiment of the present disclosure.

A method according to a second embodiment of the present disclosure is schematically illustrated in a flowchart shown in FIG. 18 and is described in detail below. It has, however, to be understood that this is only an example of a suitable method for forming a device according to the disclosure, and that the sequence of the process steps as described hereinafter is not limiting the disclosure.

A number of steps of this method according to the second embodiment of the disclosure are as in the method according to the first embodiment of the disclosure, and are therefore not disclosed here in as much detail as above. Details which are lacking in the description of the second embodiment can be taken from the description of the first embodiment. A major difference between a method according to the first embodiment and a method according to the second embodiment is that in the first embodiment the heterojunction is formed at the beginning of the manufacturing method, while in the second embodiment the heterojunction is formed at the end of the manufacturing method.

In a first step 250, a substrate 20 is provided. Reference is made to FIG. 2 and the corresponding description above. Preferably the substrate 20 is a semiconductor substrate, e.g. a silicon substrate or a silicon on insulator (SOI) substrate. The semiconductor substrate 20 may be intrinsic to lowly doped with a particular dopant type, e.g. P-type doped, and with a doping level which may be in the range of intrinsic to $10^{16}$/cc doping. The semiconductor substrate 20 may have any suitable thickness for providing the nanowire channel and bottom junction region for the NW-TFET structure to be provided on the substrate 20, for example between 20 nm and 750 μm.

On top of a major surface of the substrate 20, a sacrificial layer 21 is provided (step 251). The sacrificial layer can be made of any suitable crystalline material which is selectively removable towards the underlying substrate 20, and towards a hardmask 22 to be provided on top thereof. The sacrificial layer 21 can for example comprise or consist of crystalline semiconductor material, for example crystalline SiGe. SiGe may be particularly good as a semiconductor material to be applied on a silicon substrate 20, in view of its being able to be manufactured on silicon wafers using conventional silicon processing toolsets. The sacrificial layer 21 may have a thickness which is at least sufficient to isolate the source contact from the gate and still have a gate overlap, for example a thickness of about 120 nm.

The substrate 20 and the sacrificial layer 21 together form a stack 24.

A hardmask layer 22 is provided (step 252) on the sacrificial layer 21. The hardmask layer 22 may for example consist of a material suitable for being used during lithography (patterning), such as for example a low temperature oxide or nitride. The hardmask layer 22 is provided for later on patterning the underlying substrate 20 and sacrificial layer 21. The hardmask 22 may have a thickness in the range of 1 nm up to 100 nm, for example in the range of 2 nm up to 10 nm.

In a next step 253, the hardmask layer 22, the sacrificial layer 21 and the substrate 20 are patterned. This may be obtained by, on the hard mask 22, providing a layer arranged for patterning the underlying layers forming a nanometer-scale temporary mask 23 that protects selected areas of the underlying layers 20, 21 during subsequent process steps. In the particular method illustrated, some of the selected areas protected by the mask 23 are the areas where later during the process nanowires will be formed.

The mask 23 is then used for processing the layers underneath the mask 23: the hard mask 22, the sacrificial layer 21 and the substrate 20. The hard mask 22 and the sacrificial layer 21 as well as part of the substrate 20 are removed by any suitable method from locations where no mask features 23 are present, for example by dry etching, thus forming at least one nanowire 30 on the remainder part of the substrate 20, as illustrated in FIG. 3. The diameter of the nanowire 30 may be between 1 and 500 nm, e.g. between 2 and 200 nm, and the length of the nanowire may be between 5 nm and 2 μm, e.g. between 10 nm and 1 μm, depending on the thicknesses of the material layers and the depth of the etch in the substrate 20.

After formation of the at least one nanowire 30, well implantations (step 254) may be performed underneath the at least one nanowire 30, so as to form in the substrate 20 a well 32 of a particular dopant type. Different types of wells 32 may be formed in the substrate 20. Suitable masks and suitable dopant elements may be used for performing the well implantations, so that first one or more wells 32a of a first dopant type and thereafter one or more wells 32b of a second dopant type may be formed (or vice versa)—see also FIG. 4. After the well implantations have been performed, an anneal may take place for diffusing the dopant atoms into substitutional positions in the crystal lattice.

In the formed well 32 and at the bottom of the nanowire 30 a bottom junction implantation is performed (step 255) with a particular dopant type, for forming the bottom junction 33 of the nanowire 30. The dopant type is different from the dopant type of the well 32 in which the bottom junction 33 is formed. The dopant level of the bottom junction 33 is high, for example in the range of $10^{18}$/cc to $10^{21}$/cc, e.g. in the range of $10^{19}$/cc to $5·10^{20}$/cc. Suitable masks and suitable dopant elements may be used for performing the bottom junction implantations. After the implantations have been performed, an anneal may take place for diffusing the dopant atoms into substitutional positions in the crystal lattice.

Both the well implantations and the bottom junction implantations may be performed under 0° tilt. In that case, the hard mask 22 and the sacrificial layer 21 protect the channel 34 formed by the substrate 20 material of the nanowire 30 during implantation.

Optionally, for increased protection, and not illustrated in the drawings, the implantations may be performed after the deposition of a protection layer, for example an oxide layer, on the channel 34 of the nanowire 30, to avoid implantation of species in the channel 34. Alternatively, implantation may be performed in the presence of a post etch curing oxide. The resulting structure is illustrated in FIG. 3.

After the implantations of the well 32 and the bottom junction 33, the hard mask 22 is removed (step 256), for example by etching back or by resist stripping, e.g. in-situ removal takes place.

Figure 19:
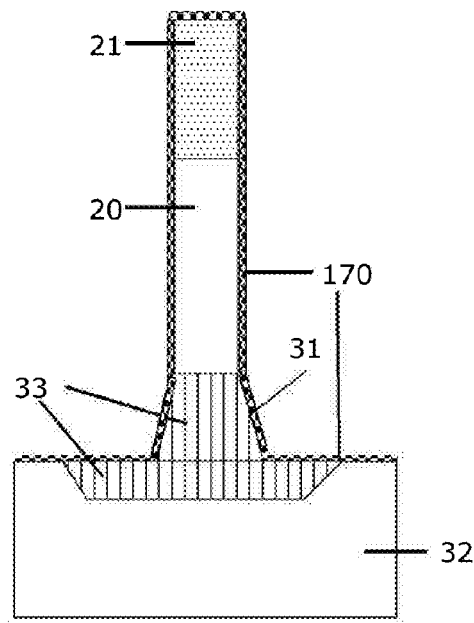
FIG. 19 to FIG. 27 illustrate subsequent process steps in a manufacturing method according to the second embodiment of the present disclosure.

In a next step 257, the nanowire 30 is capped with a capping layer 170, as illustrated in FIG. 19. The capping layer 170 is provided on all free surfaces of the nanowire 30. The capping layer material depends on the channel and heterojunction materials, as the capping layer 170 has to be compatible with both. In the embodiments illustrated, Si is a possible candidate material for the capping layer 70, in view of the channel being made from i-Si and the sacrificial layer being made from crystalline material, e.g. c-SiGe. The capping layer 170 may be epitaxially grown. The thickness of the capping layer 170 may be in the range of 1 to 3 nm. In particular embodiments, the thickness of the capping layer 170 may be not more than a few atomic layers. This provision of the capping layer 170 is the reason why, in accordance with the second embodiment, the sacrificial material 21 needs to be crystalline material; otherwise a crystalline capping layer 170 cannot be grown onto it. The capping layer 170 thickness can be optimized taking into account the consumption of this capping layer 170 material during the next processing steps of the integration flow, and the electrical effect of its presence underneath the gate stack to be formed later. The capping layer 170 avoids surface dependent gate dielectric quality in the gate overlap region on the heterojunction.

It has to be noted that provision of the capping layer 170 after provision of the bottom junction as in accordance with the second embodiment of the present disclosure is only possible in circumstances where the gate does not need to be contacted during opening of the contact areas. This means that in this case low resistive gate material is to be used with the desired work function. If not, the capping layer 170 blocks the etching during opening of the contact areas, as such etching needs to be selective towards the Si of the gate stack. Also during gate stack etching this capping layer cannot be removed because otherwise also the protection of the tunnel diodes would be etched away.

Figure 20:
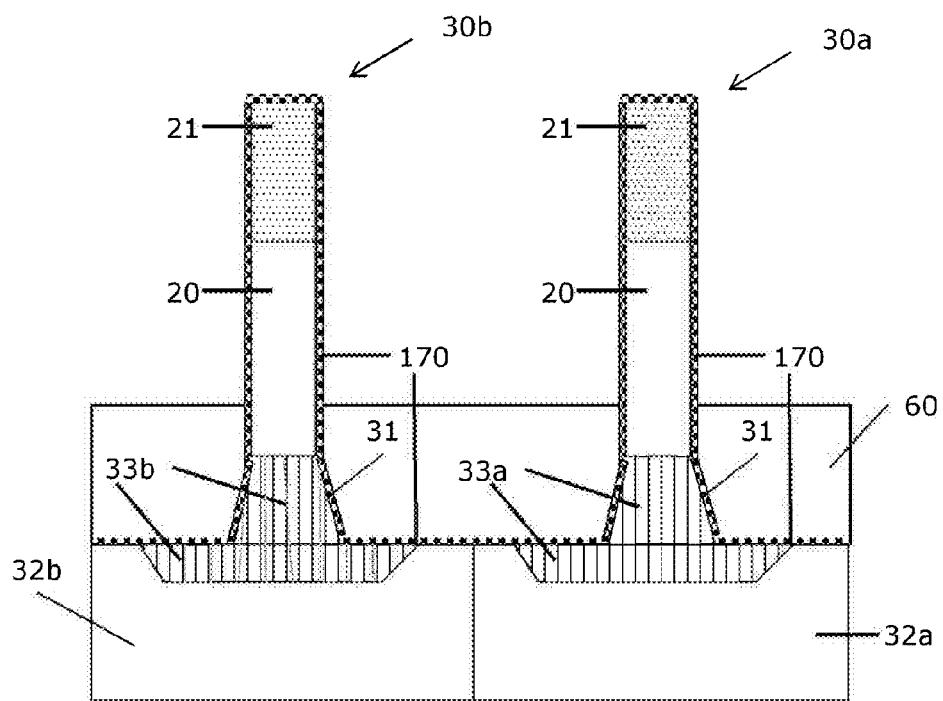
Figure 21:
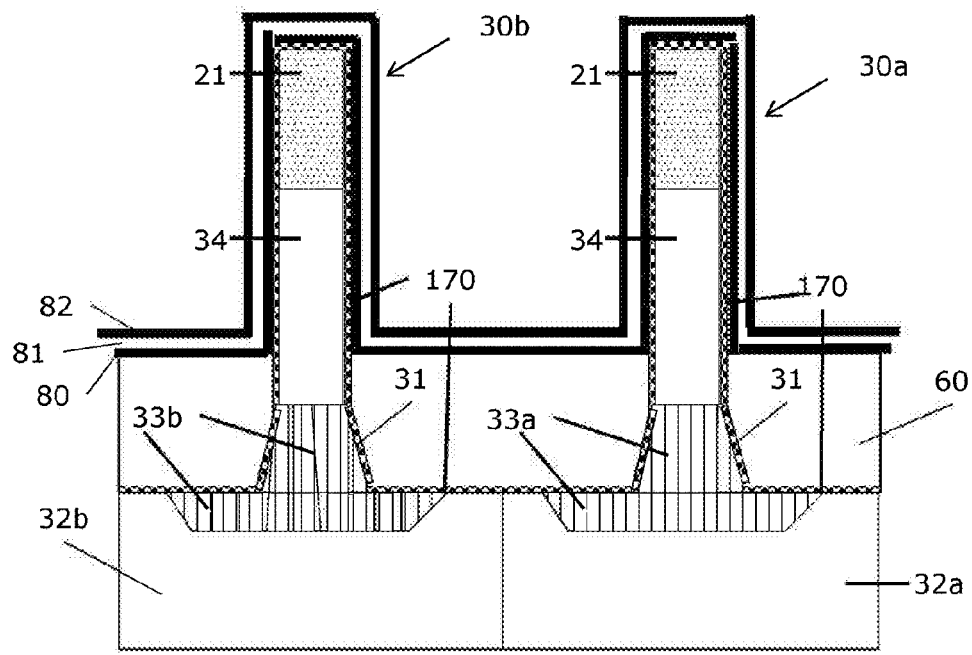

In a next step 258, a bottom insulation 60 is provided around the bottom part of the at least one nanowire 30, and between the nanowires 30 if a plurality of these have been provided, as illustrated in FIG. 20. This insulating layer 60 insulates the nanowires 30 from one another. The bottom insulation 60 may comprise oxide, such as for example low-k oxide, HDP oxide or another suitable insulating material.

In a next step 259, a gate stack may be provided onto the sidewalls of the channel 34 of the nanowire 30 and patterned, as illustrated in FIG. 19. Such gate stack comprises a high-k dielectric layer 80, e.g. a high-k oxide such as hafnium oxide, which is provided on the capping layer 170 and optionally partly also on the bottom insulation 60. The thickness of the high-k dielectric layer 80 may be in the range of 0.5 nm to 20 nm. The gate dielectric 80 covers the outer walls of the channel 34. On top of the high-k dielectric layer 80, a metal gate 81 is provided. This metal gate 81 determines the workfunction of the TFET. Suitable metals for forming the metal gate 81 may be Al, W, Ta, Ti, Ru, Pd, Rh, Re, Pt and alloys thereof. On top of the metal gate 81, a layer of a suitable material for later on forming a low resistive metal contact is provided, e.g. an amorphous semiconductor layer 82, e.g. a-Si, is provided, as used in CMOS for electrically contacting the metal gate 81. The thickness of the a-Si layer 82 is optimized for a predetermined silicide thickness to be obtained later during the process. The complete gate stack, i.e. the high-k dielectric layer 80, the metal gate 81 and the a-Si layer 82 have a thickness such that the total stack thickness determines the minimum gate length.

After providing the gate stack 80, 81, 82, it may optionally be patterned (step 260) for separating the different gate stacks from one another (not illustrated in the drawings). This patterning may be performed by means of a resist masked dry etch of the gate stack 80, 81, 82 in an isotropic way. In particular embodiments, the patterning is such that gate stacks of nanowires of different type are not electrically connected to each other. This patterning is such that the metal gate 81 does not extend over the dielectric layer 81, hence is not in direct contact with any of the shell 70 or the bottom insulation 60. The gate structure comprising gate dielectric 80 and metal gate 81 can be referred to as an all around gate structure.

Patterning of the gate stack for separation of the gates does not need to be performed immediately after the gate stack deposition; it can also be done later. However, patterning the gate stack immediately after deposition thereof avoids problems near the dummy structures for CMP.

Figure 22:
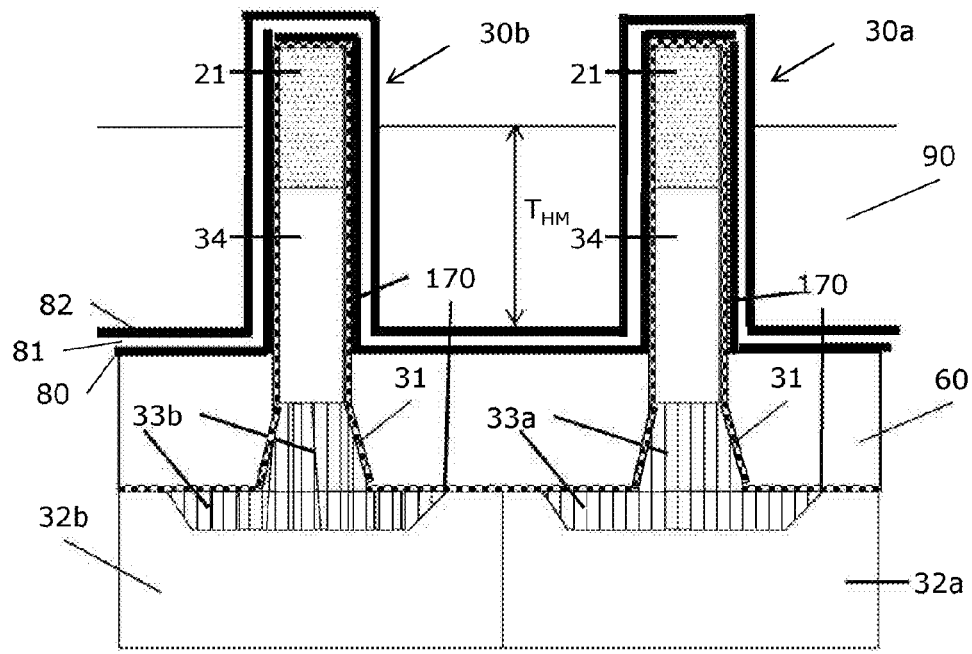

In a next step 261, a gate hard mask 90 is provided over the gate stack, as illustrated in FIG. 22. This gate hard mask 90 may for example be an oxide layer, e.g. a HDP oxide. The material of the gate hard mask may be different from the material of the bottom insulation layer 60. The provided gate hard mask 90 is planarised, for example by a mechanical planarization method such as e.g. CMP, followed by an etch back step for removing part of the gate hard mask material around the nanowires, so as to reveal the top of the nanowires as illustrated in FIG. 22. The thickness $T_{HM}$ of the remaining hard mask 90 must be sufficient to guarantee that the gate stack 80, 81, 82 after patterning using the hard mask 90 overlaps on the tunnel junction formed between the channel 34 and the tunnel diode material which will replace the sacrificial material 21.

Figure 23:
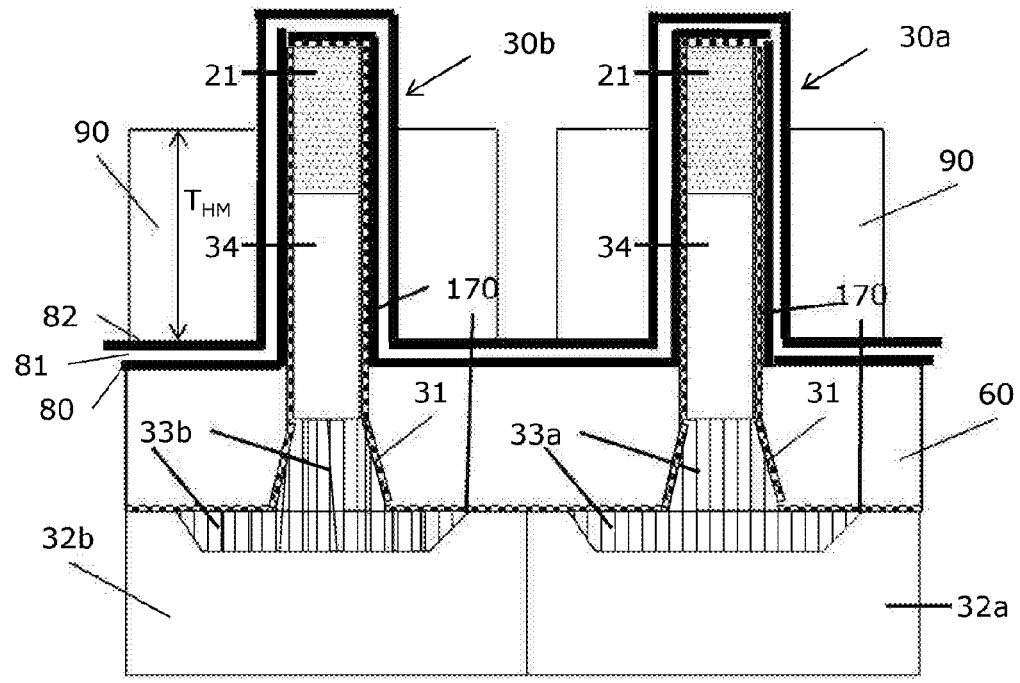

If the gate stack 80, 81, 82 has not been patterned for separation in step 216, the gate hard mask 90 is furthermore patterned so as to reveal parts of the gate stack 80, 81, 82 where gates of different nanowires need to be separated. This is illustrated in FIG. 23.

Figure 24:
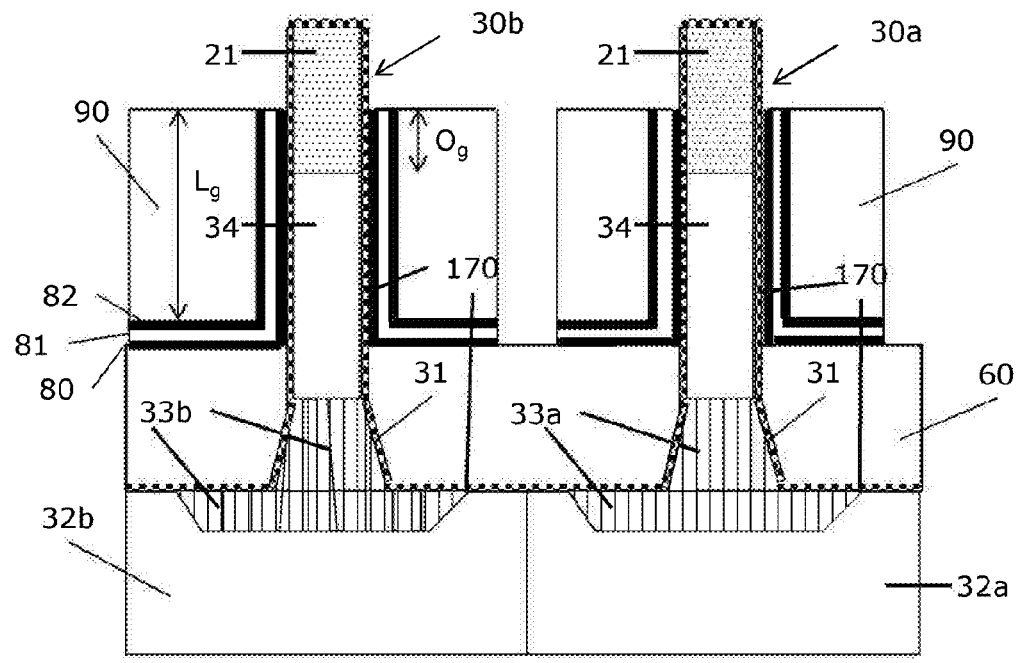

The gate hard mask 90 is used in a next step 262 as a hard mask to pattern the gate stack 80, 81, 82. This is illustrated in FIG. 24. The patterning of the gate stack 80, 81, 82 comprises subsequent removal steps of the revealed part of a-Si layer 82, of the revealed part of the metal layer 81 and of the revealed part of the high-k dielectric layer 80. By patterning the gate stack 80, 81, 82 part of the capping layer 170 is revealed. If the capping layer 170 is made from Si, standard CMOS recipes can be used during further processing.

By the patterning of the gate stack 80, 81, 81 using the gate hard mask 90, the gate length Lg is defined, which corresponds to the thickness $T_{HM}$ of the hard mask 90. Moreover, the thickness $T_{HM}$ of the hard mask 90 defines the gate overlap $O_g$, i.e. the length the gate overlaps the sacrificial layer 21, which later on will be replaced by tunnel diode material.

Figure 25:
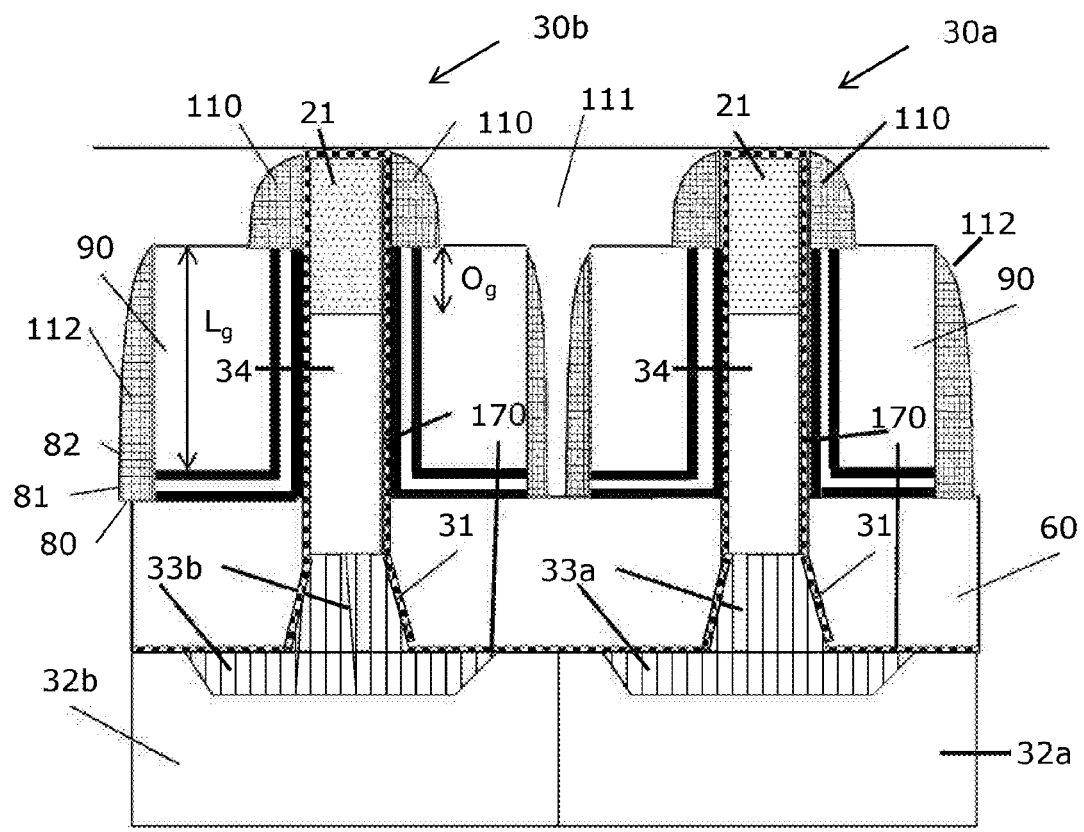

As illustrated in FIG. 25, after patterning the gate stack 80, 81, 82, the revealed part of the nanowire 30 is insulated (step 263). This may be done by first providing insulation spacers 110 against the sidewalls of the revealed parts of the nanowires. Further insulating spacers 112 may also be formed at the sidewalls of the gate hard mask 90. The spacers 110, 112 may for example be formed by blanket deposition of an insulation layer material, for example SiN, and removing a portion of the insulation layer material so that spacers 110 are formed on the sidewalls of the revealed part of the nanowire 30 and spacers 112 are formed on the sidewalls of the gate hard mask 90. Removing a portion of the insulation layer material may be done by etching the insulation layer material. The insulating spacers 110 are not strictly necessary for insulating the revealed part of the nanowires. Top isolation without spacers 110 is possible in accordance with embodiments of the present disclosure. Nevertheless, the optional spacers 110 are advantageous for avoiding cross contamination of the metal gate. Furthermore, the insulation spacers 110 may also be used as a stressor layer for strain engineering. Strain engineering leads to bandgap variation, which may provide tunneling efficiency tuning.

On top of or instead of the insulation spacers 110, 112 a further insulation layer 111 may be provided over the gate hard mask 90 (step 262), the insulation spacers 110 and the revealed parts of the nanowires 30. The further insulation layer 111 may be deposited. It may comprise or consist of for example HDP oxide. Once provided, e.g. deposited, the further insulation layer 111 may be planarized, for example in a mechanical planarization step such as CMP, and an insulating material etch back may be performed so as to reveal the top of the nanowires 30 (step 264). This is illustrated in FIG. 25. The further insulation material 111 may be different from the gate hard mask material 90, but should be compatible with etching and cleaning chemistry used during future opening of contact regions.

Figure 26:
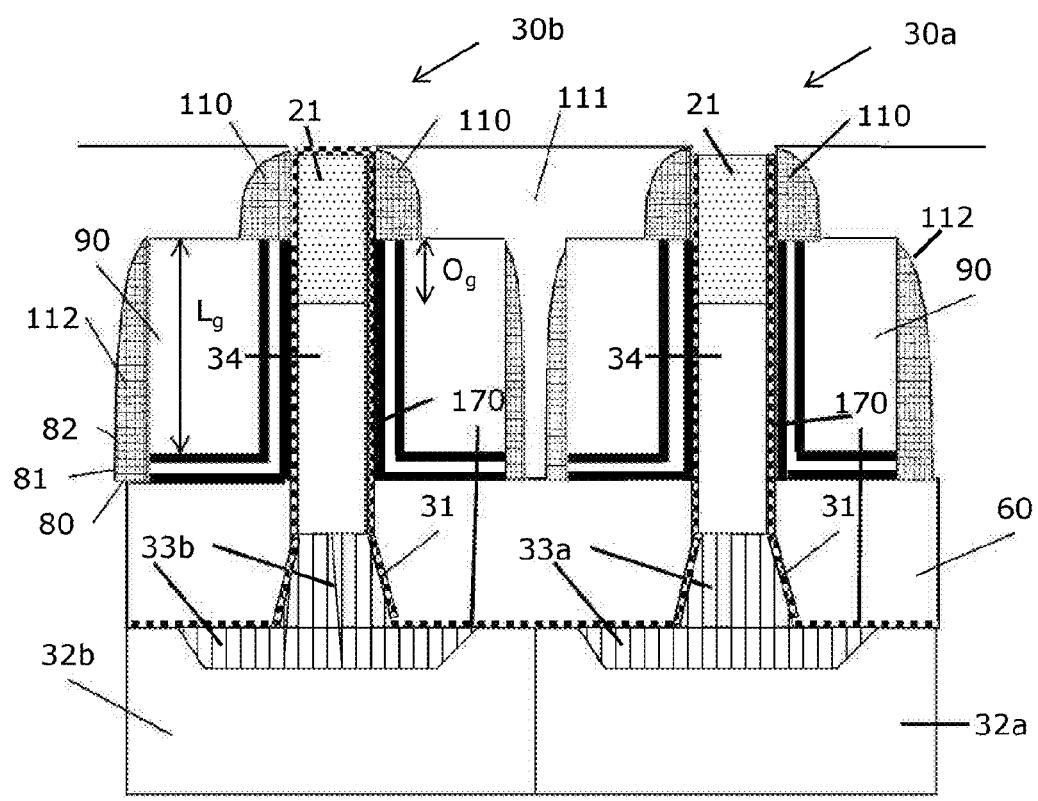
Figure 27:
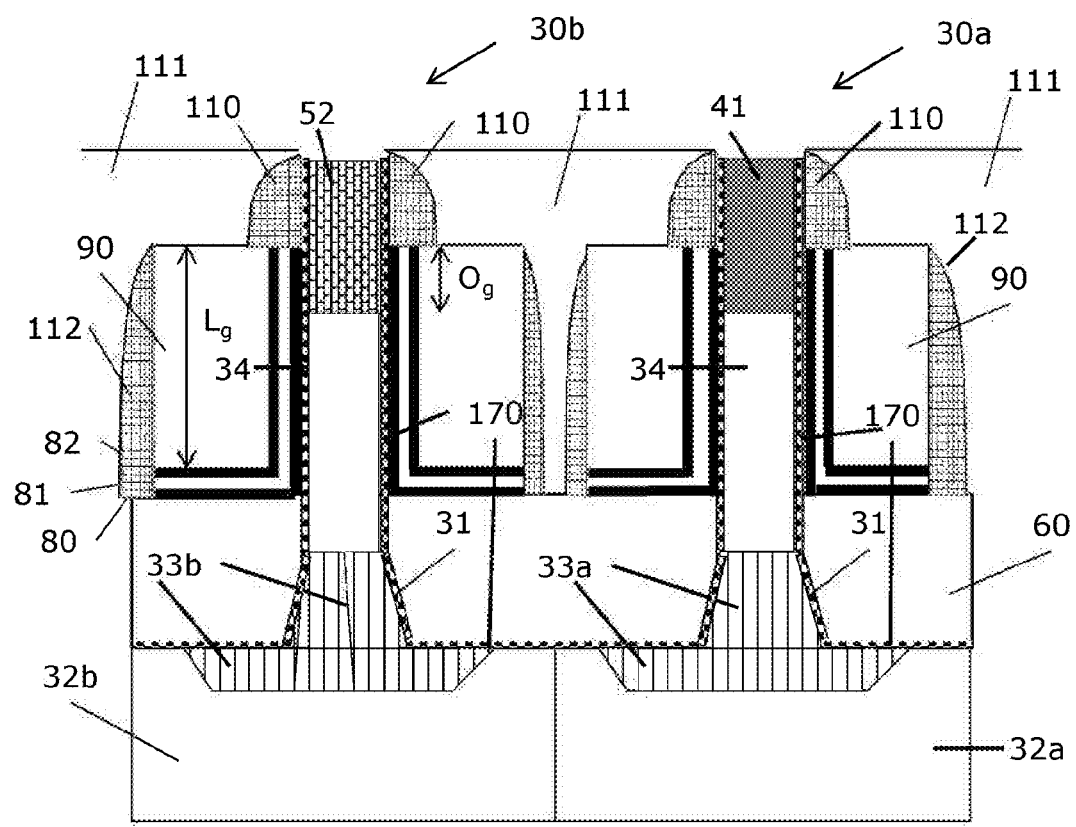

After revealing the top of the nanowires 30, the capping layer 170 is removed, e.g. etched back, from the top of the nanowires 30 (step 265), so as to reveal the sacrificial material 21 of the nanowires 30—see FIG. 26. This etching back of the capping layer 170 may be performed selectively for one type of nanowire 30 at a time; in FIG. 26 it is illustrated for the right hand nanowire 30a.

For such etching back of the capping layer 170, resist patterning may be used, which may be based on a same reticle as the one for the bottom junction implantation for forming the bottom junction(s) 33a. The thus provided resist mask (not illustrated in the drawings), may be used for etching back the capping layer 170 at the level of one or more nanowires 30 of a particular type, while nanowires 30 of another type remain covered by the capping layer 170.

After etching back the capping layer 170, the sacrificial layer 21 in the nanowire 30a which is revealed by etching back the capping layer 170 of that nanowire 30b, is removed (step 266) by an appropriate selective removal mechanism, for example a selective etchback of the sacrificial layer material 21, e.g. c-SiGe, towards the material of the channel 34, and the material of the capping layer 170. The obtained hole is filed, e.g. by in-situ deposition, with suitable tunnel diode material 41, e.g. P+ doped c-SiGe. In particular embodiments, the tunnel diode material 41 is $Si_{1-x}Ge_x$ with x>0.5. In particular embodiments of the present disclosure, the steps of removal of the sacrificial layer 21 and provision of the tunnel diode material 41 can be performed in one step in an epireactor. The doping level of the tunnel diode material 41 is high, for example in the range of $10^{18}$/cc to $10^{21}$/cc. In particular embodiments of the present disclosure, the doping level may be in the range of $10^{19}$/cc to $5 \times 10^{20}$/cc. The doping level of the tunnel diode material 41 may be higher than the doping level of the bottom junction 33a.

After formation of the first tunnel junction 41, a protection material, for example a protection oxide may be provided, e.g. deposited, on this first tunnel junction 41 (not illustrated in the drawings). The capping layer 170 is then etched back at the level of a second type of tunnel junction, in the embodiment illustrated at the level of the left hand nanowire 30b. For this etching back of the capping layer 170, resist patterning may be used, which may be based on a same reticle as the one for the bottom P+-junction implantation 33b. The thus provided resist mask (not illustrated in the drawings), may be used for etching back the capping layer 170 at the level of one or more nanowires 30b of a second type.

After etching back the capping layer 170 at the level of the second type nanowires 30b, the sacrificial layer 21 in the nanowire 30b which is revealed by etching back the capping layer 170, is removed by an appropriate selective removal mechanism, for example a selective etchback of the sacrificial layer material 21, e.g. c-SiGe, towards the material of the channel 34, e.g. i-Si, and the material of the capping layer 170. The obtained hole is filed, e.g. by in-situ deposition, with suitable tunnel diode material 52 (step 267), e.g. N+ doped c-III/V material, e.g. In, Ga, As, Sb, Al, P, B, N or binary, tertiary or quaternary compounds thereof. In particular embodiments of the present disclosure, the steps of removal of the sacrificial layer 21 and provision of the tunnel diode material 52 can be performed in one step in an epireactor. The doping level of the tunnel diode material 51 is high, for example in the range of $10^{18}$/cc to $10^{21}$/cc. In particular embodiments of the present disclosure, the doping level may be in the range of $10^{19}$/cc to $5 \times 10^{20}$/cc. The doping level of the tunnel diode material 52 may be higher than the doping level of the bottom junction 33b.

It is an advantage of embodiments of the present disclosure that, in case of complementary TFETs, first a first type of nanowires 30a can be opened and thereafter a second type of nanowires 30b. This way, different processing can be performed for different types of nanowires 30a, 30b, although present on a same substrate area.

The remainder of the processing is as described with respect to the first embodiment, and is not repeated here again. It may comprise some or all of the steps of providing and patterning tunnel diode routing material (step 268), opening the gate, junction and substrate contacts (step 269), providing protection to the sidewalls of the openings, silicidizing the revealed gate, junction and substrate contacts (step 270), and refilling the openings with filler material. Further processing of the semiconductor device thus obtained may be conform with the standard back end of line CMOS processing.

Figure 28:
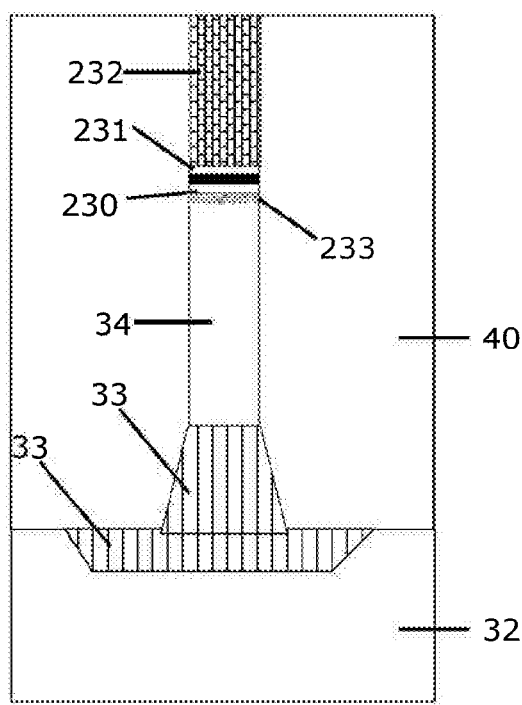
FIG. 28 illustrates an alternative embodiment for the heterojunction, which may be implemented both in a method according to the first and to the second embodiment.

In both first and second embodiments as described above, defects may appear at the interface between the channel 34 and the heterojunction 41, 52 due to lattice mismatch, depending on the thickness of the heterojunction layer 41, 52 to be provided and diameter $\Phi_{NW}$ of the nanowire 30a, 30b. This problem can be alleviated by growing a thin crystalline heterojunction, possibly a crystalline heterojunction comprising a plurality of crystalline layers 230, 231 as illustrated in FIG. 28, and continuing the growth of the heterojunction with an amorphous layer 232. The crystalline layers 230, 231 may for example be a c-Ge and a c-SiGe layer. This avoids facet limited growth in small windows. A defect-free channel/heterojunction interface may be obtained by limiting the crystalline layer thickness with a maximum Ge content and doping concentration. Tunneling is not affected for a maximum bandgap lowering with an as abrupt as possible junction profile. In a particular embodiment of the present disclosure, a few atomic layers, e.g. not more than 20 atomic layers, such as not more than 10 atomic layers or not more than 5 atomic layers, of pure Ge or SiGe (with an as high as possible Ge content) may be provided at the interface of the P-type tunnel junction with the channel 34 to avoid P-type dopant diffusion, e.g. B-diffusion, in the channel 34. This improves the junction abruptness.

In one embodiment, for a p+ source, layers 231 and 232 may be B-doped layers. Under the diffusion barrier layer 230, e.g. a c-Ge layer, an n+ Si layer 233 may be provided. A limitation on the thermal budget is the consequence.

For an n+ source (e.g. III-V material) a p+ layer is a good option for layer 233 an n+ region may be provided between a p+ tunnel diode 232 and an i-Si channel 34.

While the disclosure has been illustrated and described in detail in the drawings and foregoing description, such illustration and description are to be considered illustrative or exemplary and not restrictive. The disclosure is not limited to the disclosed embodiments. Variations to the disclosed embodiments can be understood and effected by those skilled in the art in practicing the claimed disclosure, from a study of the drawings, the disclosure and the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated.

Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A method for manufacturing a complementary nanowire tunnel field effect transistor semiconductor device, comprising:
    providing a stack comprising a layer of sacrificial material atop a layer of channel material;
    removing material from the layer of channel material and the layer of sacrificial material so as to form at least one first nanowire and at least one second nanowire;
    forming a nanowire tunnel field effect transistor of a first dopant type by removing and replacing the sacrificial material in the at least one first nanowire with heterojunction material of a first doping material of a first dopant type; and thereafter
    forming a nanowire tunnel field effect transistor of a second dopant type by removing replacing the sacrificial material in the at least one second nanowire with heterojunction material of a second doping material of a second dopant type, whereby a complementary nanowire tunnel field effect transistor device comprising at least one nanowire tunnel field effect transistor of the first dopant type and at least one nanowire tunnel field effect transistor of the second dopant type is obtained.

2. The method according to claim 1, wherein providing a stack comprises providing a layer of crystalline channel material.

3. The method according to claim 1, further comprising, after forming the nanowire tunnel field effect transistor, embedding the nanowire tunnel field effect transistor in insulating material.

4. The method according to claim 3, further comprising, before embedding the nanowire tunnel field effect transistor, covering the nanowire tunnel field effect transistor with a capping layer.

5. The method according to claim 4, wherein covering the nanowire tunnel field effect transistor with a capping layer comprises providing 20 atomic layers or less of semiconductor material.

6. The method according to claim 1, wherein removing replacing the sacrificial material comprises selectively etching back the sacrificial material.

7. The method according to claim 1, further comprising forming a gate stack around at least one of the first nanowire and the second nanowire.

8. The method according to claim 7, wherein removing replacing the sacrificial material is performed before forming the gate stack.

9. The method according to claim 7, wherein removing replacing the sacrificial material is performed after forming the gate stack.

10. A semiconductor device prepared according to the method of claim 1, the device comprising at least one vertical tunnel field effect transistor, the tunnel field effect transistor comprising a nanowire comprising a channel material and a heterojunction, wherein the nanowire is surrounded by a shell, at least at an interface between the channel material and the heterojunction.

11. The semiconductor device according to claim 10, wherein the semiconductor device comprises at least two vertical tunnel field effect transistors of different dopant types.

12. The method according to claim 1, wherein all sacrificial material is removed and replaced such that the complementary nanowire tunnel field effect transistor semiconductor device contains no sacrificial material.

* * * * *